US009245782B2

(12) United States Patent
Yoshioka et al.

(10) Patent No.: US 9,245,782 B2
(45) Date of Patent: Jan. 26, 2016

(54) ARTICLE STORAGE FACILITY AND ARTICLE TRANSPORT FACILITY

(71) Applicant: Daifuku Co., Ltd., Osaka-shi (JP)

(72) Inventors: Hideo Yoshioka, Gamo-gun (JP); Takamichi Kanno, Gamo-gun (JP)

(73) Assignee: Daifuku Co., Ltd., Osaka-shi (JP)

( * ) Notice: Subject to any disclaimer, the term of this patent is extended or adjusted under 35 U.S.C. 154(b) by 108 days.

(21) Appl. No.: 13/850,492

(22) Filed: Mar. 26, 2013

(65) Prior Publication Data
US 2014/0112741 A1    Apr. 24, 2014

(30) Foreign Application Priority Data
Mar. 27, 2012    (JP) .................................. 2012-071915

(51) Int. Cl.
H01L 21/677    (2006.01)
H01L 21/673    (2006.01)
H01L 21/687    (2006.01)

(52) U.S. Cl.
CPC .......... H01L 21/677 (2013.01); H01L 21/6773 (2013.01); H01L 21/67359 (2013.01); H01L 21/67379 (2013.01); H01L 21/67727 (2013.01); H01L 21/67733 (2013.01); H01L 21/67769 (2013.01); H01L 21/68707 (2013.01)

(58) Field of Classification Search
USPC ......................................... 414/281, 282, 940
See application file for complete search history.

(56) References Cited

U.S. PATENT DOCUMENTS

| 5,059,079 A * | 10/1991 | Foulke et al. ................ 414/275 |
| 6,726,429 B2 * | 4/2004 | Sackett et al. ................ 414/217 |
| 2006/0126042 A1 * | 6/2006 | Matsutori et al. ............... 355/53 |
| 2008/0152466 A1 | 6/2008 | Bonora et al. |

FOREIGN PATENT DOCUMENTS

| JP | 870027 A | 3/1996 |
| JP | 2000091401 A | 3/2000 |
| JP | 20051886 A | 1/2005 |
| JP | 2010514211 A | 4/2010 |

* cited by examiner

*Primary Examiner* — Ernesto Suarez
*Assistant Examiner* — Ronald Jarrett
(74) *Attorney, Agent, or Firm* — The Webb Law Firm

(57) ABSTRACT

An article storage facility includes a storage rack configured to store a semiconductor wafer and a reticle, and a storage and retrieval transport apparatus. The storage rack includes a first accommodation unit configured to store a wafer container for containing the semiconductor wafer, and a second accommodation unit configured to store a reticle container for containing the reticle. The storage and retrieval transport apparatus includes a holding unit configured to hold a top flange formed at an upper portion of the wafer container to support the wafer container in a hanging state. A flange portion configured to allow the storage and retrieval transport apparatus to hold the reticle container using the holding unit to support the reticle container in a hanging state is formed at an upper portion of the reticle container.

12 Claims, 15 Drawing Sheets

ARTICLE STORAGE FACILITY AND ARTICLE TRANSPORT FACILITY

FIELD OF THE INVENTION

The present invention relates to article storage facilities that include a storage rack for storing semiconductor wafers and reticles and a storage and retrieval transport apparatus, and to article transport facilities that include the article storage facility.

BACKGROUND

Such article storage facilities are used to store semiconductor wafers and reticles that are used during exposure of the semiconductor wafers. Specifically, the stored semiconductor wafers and reticles are retrieved from the storage rack before being transported to an exposure process apparatus.

Incidentally, although the exposed semiconductor wafer is transported to another processing apparatus for the next process, that semiconductor wafer may be put back and stored in the storage rack or stored in another storage rack for temporal storage.

The reticle that has been used is typically put back and stored in the storage rack.

JP 2000-91401A (Patent Document 1) discloses an example of such an article storage facility.

In the configuration of Patent Document 1, a semiconductor wafer that is contained in a wafer container is stored on a cassette shelf in a storage rack, and a reticle is directly placed and stored on a reticle shelf in the storage rack or a reticle that is placed on a reticle carrier is stored on the reticle shelf. An empty container that has the same style as that of the wafer container is stored in the storage rack.

A storage and retrieval transport apparatus includes a cassette hand for holding the wafer container, a reticle hand for holding the reticle carrier, and an opening and closing mechanism for opening and closing the lid of the empty container having the same style as that of the wafer container.

When the wafer container is moved out of storage, the storage and retrieval transport apparatus transports the wafer container from the cassette shelf to a storage and retrieval location.

When the reticle is moved out of storage, the storage and retrieval transport apparatus previously removes from the storage rack the empty container having the same style as that of the wafer container, and opens the lid of the empty container. Next, the storage and retrieval transport apparatus puts the reticle or the reticle carrier carrying the reticle that has been removed from the reticle shelf, into the empty container whose lid is opened, and thereafter, closes the lid of the container, and transports the container to the storage and retrieval location.

Although Patent Document 1 does not describe the process of moving the wafer container into storage in detail, the wafer container may be moved into storage by the storage and retrieval transport apparatus transporting the wafer container from the storage and retrieval location to the cassette shelf.

Also, the reticle may be moved into storage as follows. The storage and retrieval transport apparatus may receive from the storage and retrieval location the container containing the reticle or the reticle carrier carrying the reticle, open the lid of the received container, extract the reticle or the reticle carrier carrying the reticle from the container whose lid has been removed, and transport the reticle or the reticle carrier carrying the reticle to the reticle shelf. Thereafter, the storage and retrieval transport apparatus may close the lid of the empty container from which the reticle or the reticle carrier carrying the reticle has been extracted, and place the empty container in the storage rack.

Also, although Patent Document 1 does not describe a specific configuration that allows the cassette hand to support the wafer container or a specific configuration that allows the reticle hand to support the reticle or the reticle carrier, the drawings of Patent Document 1 suggests that the wafer container may be placed on and supported by the cassette hand, and the reticle or the reticle carrier may be placed on and supported by the reticle hand.

Incidentally, Patent Document 1 illustrates that the wafer container has a top flange at an upper portion thereof.

Patent Document 1 describes, although not in detail, an article transport facility in which the wafer container, or a container containing the reticle or the reticle carrier carrying the reticle, is transported to a semiconductor exposure process apparatus as the exposure process apparatus by an automated overhead transport vehicle.

In the article storage facility of Patent Document 1, it is difficult to move the reticle out of or into storage, and the storage and retrieval transport apparatus has a complicated configuration, and therefore, an improvement has been desired.

Specifically, the process of moving the reticle out of storage requires the step of removing the empty container from the storage rack and opening the lid of the empty container, the step of putting the reticle or the reticle carrier carrying the reticle that has been removed from the reticle shelf, into the empty container whose lid has been opened, the step of closing the lid of the container, and the step of transporting the container whose lid has been closed to the storage and retrieval location. Therefore, the reticle cannot be quickly moved out of storage.

The process of moving the reticle into storage requires the step of receiving the container containing the reticle or the reticle carrier carrying the reticle from the storage and retrieval location, and opening the lid of the container, the step of extracting the reticle or the reticle carrier carrying the reticle from the container whose lid has been opened, and placing the reticle or the reticle carrier carrying the reticle on the reticle shelf, the step of closing the lid of the container from which the reticle or the reticle carrier carrying the reticle has been extracted, and the step of placing the container whose lid has been closed in the storage rack. Therefore, the reticle cannot be quickly moved into storage.

In addition, the storage and retrieval transport apparatus needs to include the cassette hand for holding the wafer container, the reticle hand for holding the reticle carrier, and the opening and closing mechanism for opening and closing the lid of the empty container having the same style as that of the wafer container. Therefore, the storage and retrieval transport apparatus has a complicated configuration.

SUMMARY OF THE INVENTION

Under the above background, an article storage facility is desired that can quickly move the semiconductor wafer and the reticle into and out of storage, and allows the storage and retrieval transport apparatus to have a simpler configuration.

An article transport facility having a simpler configuration is also desired.

An article storage facility according to the present invention includes a storage rack configured to store a semiconductor wafer and a reticle, a storage and retrieval transport apparatus, a first accommodation unit provided in the storage rack and configured to store a wafer container for containing the semiconductor wafer, and a second accommodation unit provided in the storage rack and configured to store a reticle container for containing the reticle. The storage and retrieval transport apparatus includes a holding unit configured to hold a top flange formed at an upper portion of the wafer container to support the wafer container in a hanging state. A flange portion configured to allow the storage and retrieval transport apparatus to hold the reticle container using the holding unit to support the reticle container in a hanging state is formed at an upper portion of the reticle container.

Specifically, a semiconductor wafer that is contained in the wafer container is stored in the first accommodation unit of the storage rack, and a reticle that is contained in the reticle container is stored in the second accommodation unit of the storage rack.

Incidentally, typically, the wafer container contains a plurality of semiconductor wafers that are vertically arranged one on top of another, and the reticle container contains a single reticle.

The storage and retrieval transport apparatus performs the process of moving the wafer container into and out of storage while supporting the wafer container in the hanging state by holding the top flange formed at the upper portion of the wafer container using the holding unit. The storage and retrieval transport apparatus also performs the process of moving the reticle container into and out of storage while supporting the reticle container in the hanging state by holding the flange portion formed at the upper portion of the reticle container using the holding unit.

In other words, the storage and retrieval transport apparatus transports the wafer container and the reticle container using the holding unit that can hold both the top flange of the wafer container and the flange portion of the reticle container.

Therefore, when the semiconductor wafer is moved into and out of storage, the storage and retrieval transport apparatus may transport the wafer container while supporting the wafer container in the hanging state. Similarly, when the reticle is moved into and out of storage, the storage and retrieval transport apparatus may transport the reticle container while supporting the reticle container in the hanging state. As a result, the semiconductor wafer and the reticle can be quickly moved into and out of storage.

Thus, the storage and retrieval transport apparatus only needs to include the holding unit that can hold both the top flange of the wafer container and the flange portion of the reticle container, in order to transport the wafer container and the reticle container. Therefore, the configuration of the storage and retrieval transport apparatus can be simplified.

This will be described in more detail. The reticle has a smaller diameter than that of the semiconductor wafer, and therefore, the reticle container has a smaller shape than that of the wafer container as viewed from above. In the present invention, attention has been paid to the finding that a flange portion having a form similar to that of the top flange of the wafer container can be formed on the reticle container. Therefore, the flange portion having a form similar to that of the top flange of the wafer container is provided on the reticle container. As a result, the storage and retrieval transport apparatus only needs to include the holding unit that can hold both the top flange of the wafer container and the flange portion of the reticle container. Therefore, the configuration of the storage and retrieval transport apparatus can be simplified.

Preferred exemplary embodiments of the present invention will be described hereinafter.

In an embodiment of the article storage facility of the present invention, the article storage facility preferably includes a first storage and retrieval unit for the wafer container and a second storage and retrieval unit for the reticle container, the first and second storage and retrieval units being preferably provided separately from each other. The storage and retrieval transport apparatus preferably transports the wafer container between the first storage and retrieval unit and the first accommodation unit, and the reticle container between the second storage and retrieval unit and the second accommodation unit.

With the above configuration, in the configuration in which the wafer container and the reticle container are stored in the single storage rack, the wafer container and the reticle container are transported between the different storage and retrieval units and the different accommodation units. The wafer container can be prevented from being wrongly moved into and out of storage instead of the reticle container, and the reticle container can be prevented from being wrongly moved into and out of storage instead of the wafer container. As a result, the wafer container and the reticle container can be appropriately moved into and out of storage.

In another embodiment of the article storage facility of the present invention, the storage rack is preferably provided, extending through a plurality of levels of a building. The first and second storage and retrieval units are preferably provided on each of at least two of the plurality of levels.

With the above configuration, some of the plurality of levels on which the first and second storage and retrieval units are provided can be used to process the semiconductor wafer while being used as working space for processing the semiconductor wafer.

In other words, the semiconductor wafer can be processed on some of the plurality of levels on which the first and second storage and retrieval units are provided. Therefore, the space of the facility for processing the semiconductor wafer as viewed from above can be reduced.

In another embodiment of the article storage facility of the present invention, the storage and retrieval transport apparatus preferably includes a container discriminating sensor configured to determine whether or not the holding unit is holding the wafer container and whether or not the holding unit is holding the reticle container.

With the above configuration, even if a system that manages the operation of the storage and retrieval transport apparatus is interrupted due to a power failure or the like while the storage and retrieval transport apparatus is transporting the wafer container or the reticle container into or out of storage, then when the system is subsequently recovered, the wafer container or the reticle container being transported can be transported to an appropriate transport destination.

Specifically, after the recovery, the system that manages the operation of the storage and retrieval transport apparatus can determine, based on the information detected by the container discriminating sensor, whether the container being transported is the wafer container or the reticle container, and determine an appropriate transport destination for the container being transported. Therefore, the wafer container or the reticle container being transported can be transported to the appropriate transport destination.

An article transport facility according to the present invention is one that includes the article storage facility having the above configurations. The article transport facility further includes a first overhead transport vehicle configured to transport the wafer container between the first storage and retrieval unit and a wafer input and output unit in an exposure process apparatus, and a second overhead transport vehicle configured to transport the reticle container between the second storage and retrieval unit and a reticle input and output unit in the exposure process apparatus. At least a portion of travel paths for the first and second overhead transport vehicles is a common travel path portion on which both the first and second overhead transport vehicles travel. The first and second overhead transport vehicles each travel on a travel rail provided on a ceiling side along the travel paths.

Specifically, the wafer container is transported by the first overhead transport vehicle between the first storage and retrieval unit and the wafer input and output unit of a exposure process apparatus. The reticle container is transported by the second overhead transport vehicle between the second storage and retrieval unit and the reticle input and output unit of the exposure process apparatus.

Incidentally, the first overhead transport vehicle may, for example, be a hoist type overhead transport vehicle that transports the wafer container while supporting the wafer container in the hanging state by holding the top flange of the wafer container. The second overhead transport vehicle may, for example, be a hoist type overhead transport vehicle that transports the reticle container while supporting the reticle container in the hanging state by holding the flange portion of the reticle container.

At least a portion of the travel paths for allowing the first and second overhead transport vehicles to travel is a common travel path portion on which both the first and second overhead transport vehicles travel. The first and second overhead transport vehicles each travel on a travel rail provided on a ceiling side along the travel paths.

Therefore, the travel rails provided on the ceiling side along the travel paths for the first and second overhead transport vehicles can be used not only as travel rails for the first overhead transport vehicle but also as travel rails for the second overhead transport vehicle. As a result, the overall length of the travel rails for allowing the first and second overhead transport vehicles to travel can be reduced, and therefore, the entire facility can be simplified.

A travel path only for the first overhead transport vehicle and a travel path only for the second overhead transport vehicle may be provided and separated from each other. A travel rail on which the first overhead transport vehicle travels and a travel rail on which the second overhead transport vehicle travels may be provided along the respective travel paths. In this case, the overall length of the travel rails provided along both of the travel paths is disadvantageously longer.

In contrast to this, in the article transport facility of the present invention, the travel rails provided on the ceiling side along the travel paths of the first and second overhead transport vehicles can be used not only as travel rails for the first overhead transport vehicle but also as travel rails for the second overhead transport vehicle. Therefore, the overall length of the travel rails for allowing the first and second overhead transport vehicles to travel can be reduced, and therefore, the entire facility can be simplified.

DETAILED DESCRIPTION

Next, embodiments of the present invention will be described with reference to the accompanying drawings.

(Overall Configuration of Article Storage Facility)

Figure 1:
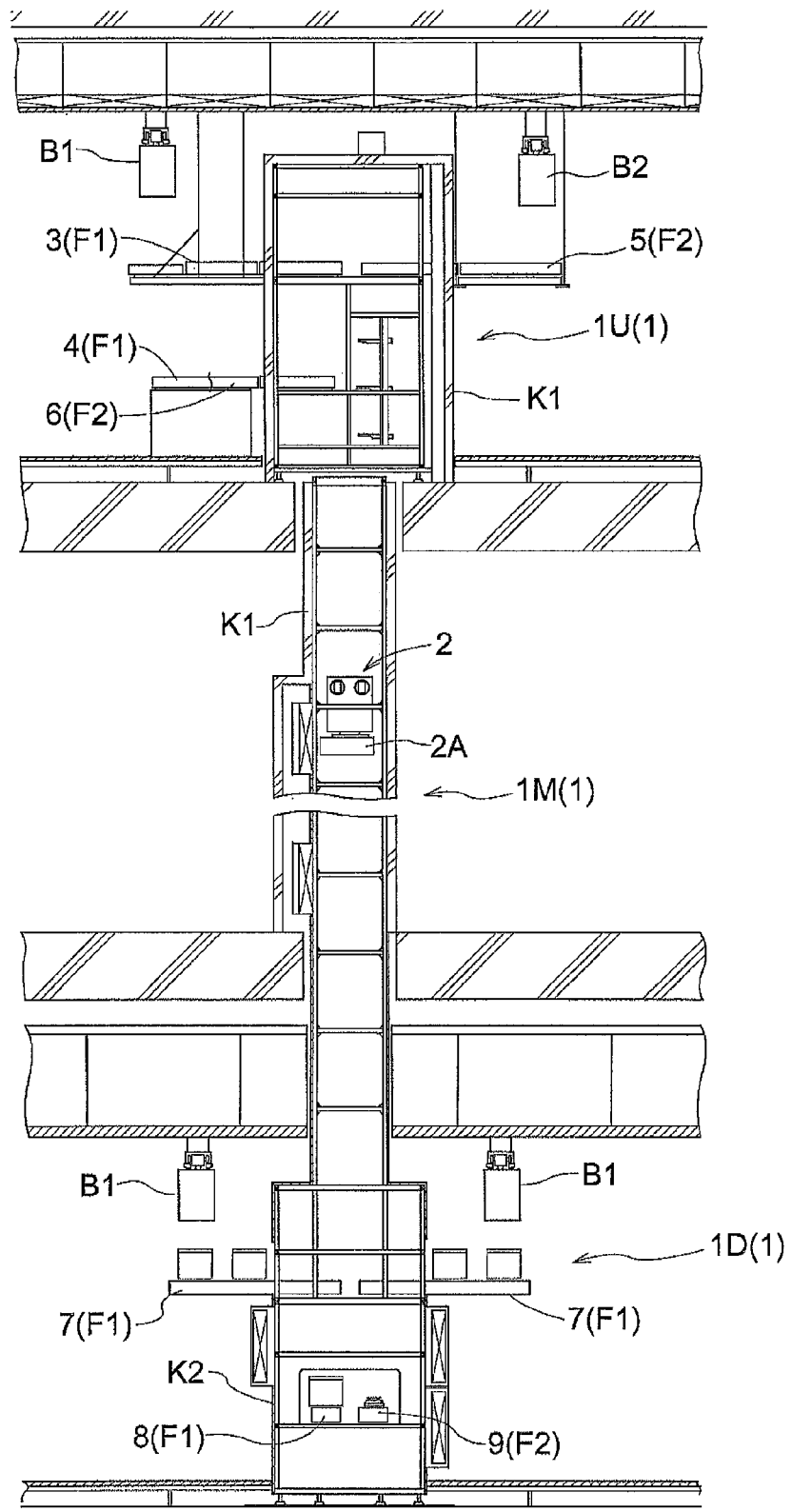
FIG. 1 is a partially cut-away front view of an article storage facility.

As shown in FIG. 1, a storage rack 1 for storing semiconductor wafers Wh (see FIG. 16) and reticles Rt (see FIG. 18) is provided, extending from the first level to the third level of a building. A vertical transport apparatus 2 (see FIG. 9) as a storage and retrieval transport apparatus is provided, extending from the first to third levels. In other words, in this embodiment, the storage rack 1 is provided, extending through a plurality of levels of the building, and here, as an example, the storage rack 1 is provided, extending through three levels of the building.

Specifically, the storage rack 1 includes a lower structure 1D provided at the first level of the building, an upper structure 1U provided at the third level of the building, and a middle structure 1M provided between the lower and upper structures 1D and 1U. The semiconductor wafers Wh and the reticles Rt are stored in the lower and upper structures 1D and 1U.

The vertical transport apparatus 2 has a vertical movement base 2A (see FIG. 9) that moves up and down in an internal space of the lower, middle, and upper structures 1D, 1M, and 1U of the storage rack 1.

In this embodiment, as can be seen from the foregoing description, the middle structure 1M forms a vertical movement path for the vertical movement base 2A of the vertical transport apparatus 2 without storing the semiconductor wafers Wh and the reticles Rt. The middle structure 1M may store the semiconductor wafers Wh and the reticles Rt.

In this embodiment, outer circumferential portions of the upper and middle structures 1U and 1M that are located above the floor surface of the second level are covered by a wall-like structure K1. Outer circumferential portions of the lower and middle structures 1D and 1M that are located below the floor surface of the second level are covered by a plate-like structure K2 (see FIG. 4).

Although not described in detail, ventilation devices for maintaining clean the internal space of the lower, middle, and upper structures 1D, 1M, and 1U are provided at some points. The first and third levels of the building are clean rooms.

Figure 2:
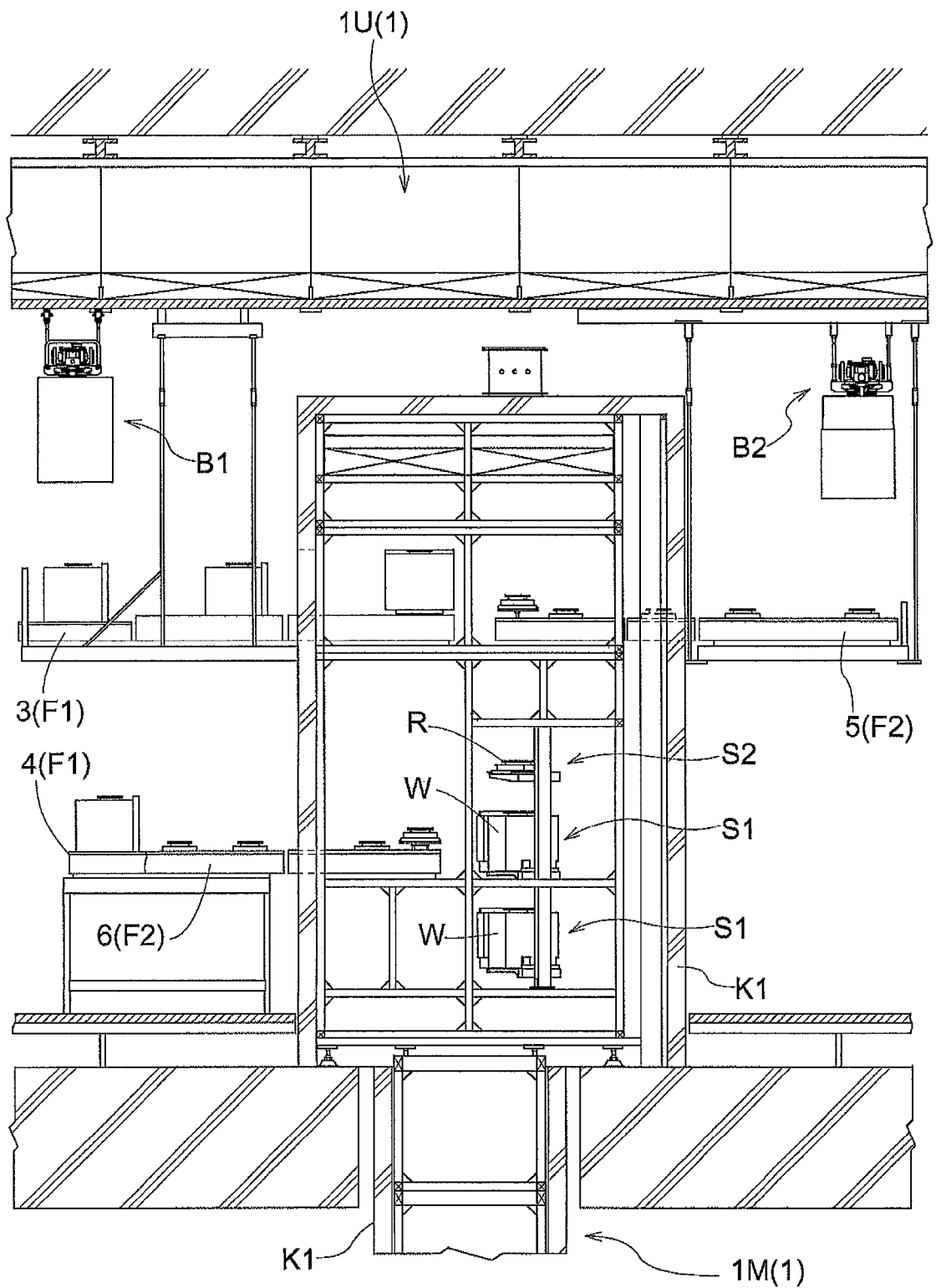
FIG. 2 is a partially cut-away front view of an upper portion of the article storage facility.
Figure 3:
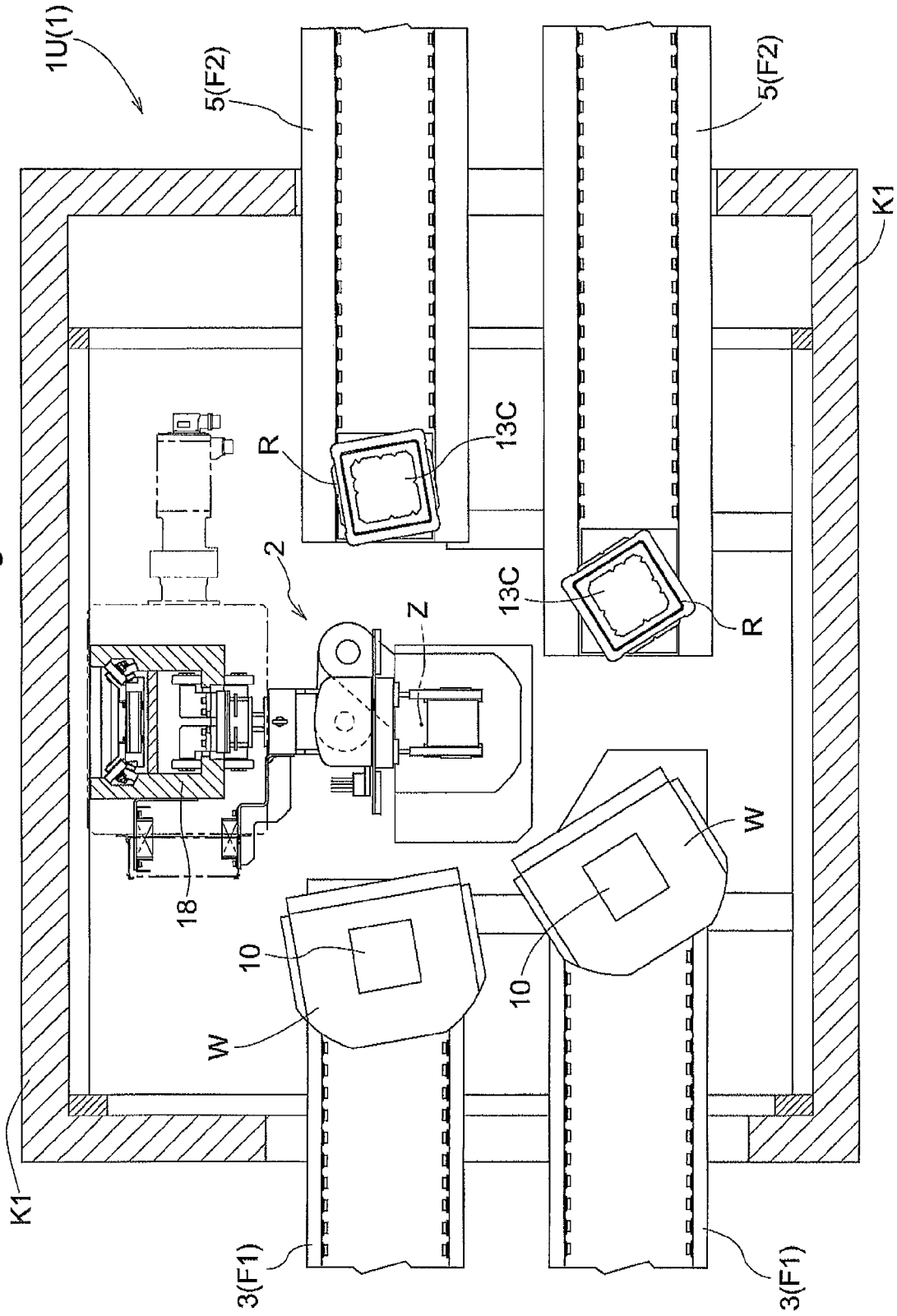
FIG. 3 is a cross-sectional plan view of the upper portion of the article storage facility.
Figure 4:
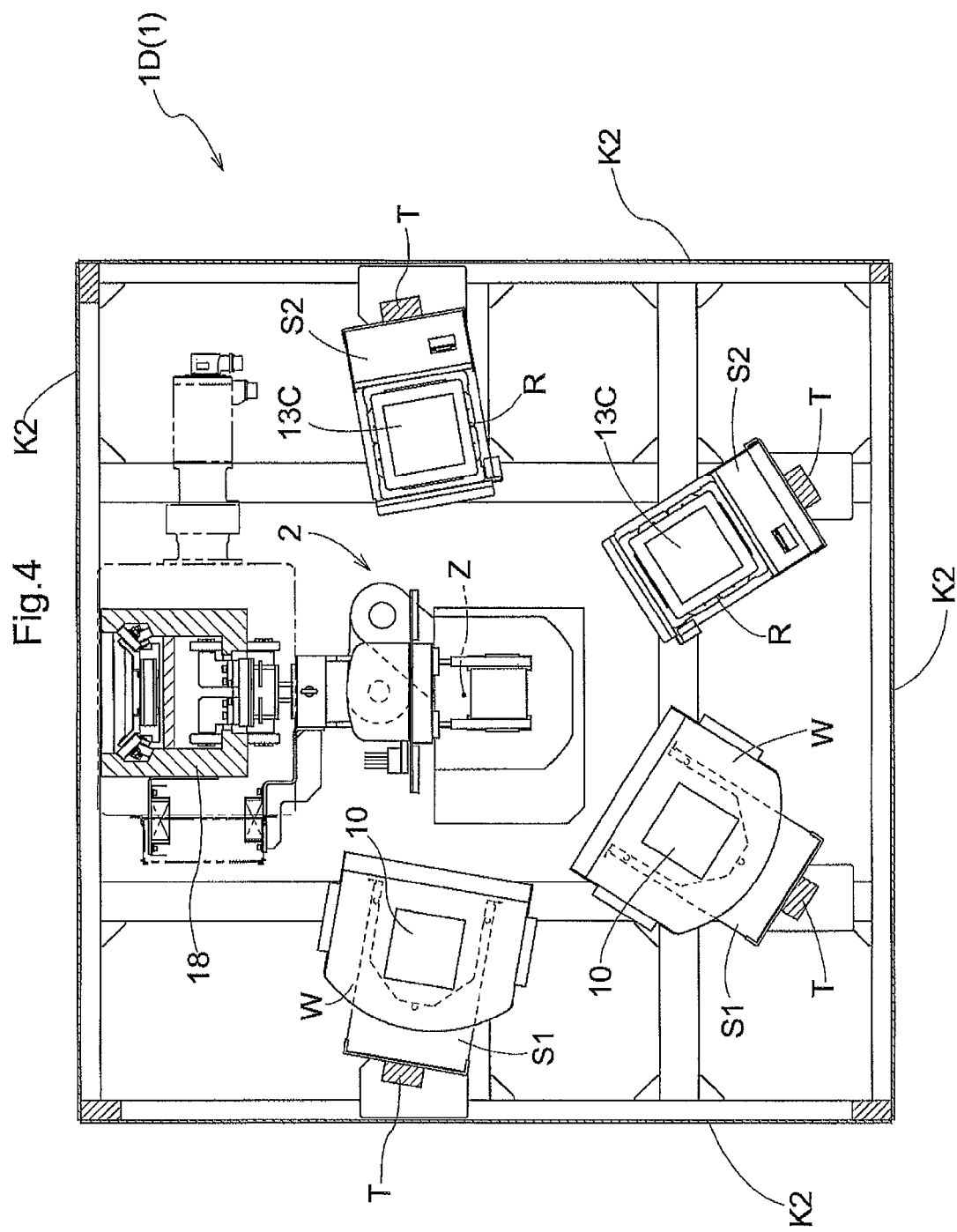
FIG. 4 is a cross-sectional plan view of a lower portion of the article storage facility.

As shown in FIGS. 2 to 4, the lower and upper structures 1D and 1U are assembled by putting elongated frame forming members together to have the outer shape of an oblong rectangular parallelepiped.

As shown in FIG. 2, the upper structure 1U includes two first accommodation units S1 for accommodating a wafer container W containing a semiconductor wafer Wh, and a second accommodation unit S2 for accommodating a reticle container R containing a reticle Rt. The two first accommodation units S1 and the second accommodation unit S2 are vertically arranged one on top of another. The numbers of the first accommodation units S1 and the second accommodation units S2 provided in the upper structure 1U may be changed when necessary.

As shown in FIG. 4, in the lower structure 1D, two first accommodation units S1 and two second accommodation units S2 are arranged in a circle or arc.

Note that, although not shown, the lower structure 1D includes two other second accommodation units S2 at locations different from those of the two first accommodation units S1 of FIG. 4. The numbers of the first accommodation units S1 and the second accommodation units S2 provided in the lower structure 1D may be changed when necessary.

As shown in FIGS. 1 to 3, the upper structure 1U includes, as a first storage and retrieval unit F1 for the wafer container W, a pair of upper wafer conveyors 3 provided at an upper left portion thereof and arranged side by side in a front-rear direction and a lower wafer conveyor 4 provided at a lower left portion thereof.

The lower wafer conveyor 4 is provided to allow a worker to manually transfer the wafer container W.

As described below, the pair of front and rear upper wafer conveyors 3 are provided to allow a hoist type first overhead transport vehicle B1 to transfer the wafer container W.

As shown in FIGS. 1 to 3, the upper structure 1U includes, as a second storage and retrieval unit F2 for the reticle container R, a pair of upper reticle conveyors 5 provided at an upper right portion and arranged side by side in the front-rear direction and a lower reticle conveyor 6 provided at a lower left portion and arranged next to the lower wafer conveyor 4 side by side in the front-rear direction.

The lower reticle conveyor 6 is provided to allow a worker to manually transfer the reticle container R.

As described below, the pair of front and rear upper reticle conveyors 5 are provided to allow a hoist type second overhead transport vehicle B2 to transfer the reticle container R.

As shown in FIG. 1, the lower structure 1D includes, as the first storage and retrieval unit F1, a pair of left and right upper wafer conveyors 7 provided at an upper portion thereof and a lower wafer conveyor 8 provided at a lower portion thereof.

The lower wafer conveyor 8 is provided to allow a worker to manually transfer the wafer container W.

The pair of left and right upper wafer conveyors 7 are provided to allow the hoist type first overhead transport vehicle B1 to transfer the wafer container W.

The lower structure 1D also includes, as the second storage and retrieval unit F2, a lower reticle conveyor 9 provided at a lower portion thereof.

The lower reticle conveyor 9 is provided to allow a worker to manually transfer the reticle container R. As described above, the first and second storage and retrieval units F1 and F2 are provided in each of the upper and lower structures 1U and 1D. The arrangement and numbers of the first and second storage and retrieval units F1 and F2 in the upper structure 1U may be changed when necessary, and the arrangement and numbers of the first and second storage and retrieval units F1 and F2 in the lower structure 1D may be changed when necessary.

In this embodiment, as described below, a container transfer device 2B (see FIG. 9) included in the vertical movement base 2A of the vertical transport apparatus 2 is configured to select a location of an object to be transferred by turning about a pivotal axis Z extending in the vertical direction.

Therefore, as shown in FIG. 4, the first accommodation unit S1 is configured to support the wafer container W while orienting the wafer container W so that the front-rear direction of the wafer container W is toward the pivotal axis Z. Similarly, the second accommodation unit S2 is configured to support the reticle container R while orienting the reticle container R so that the front-rear direction of the reticle container R is toward the pivotal axis Z.

As shown in FIG. 3, in this embodiment, the container transport conveyors included in the upper structure 1U, i.e., the upper wafer conveyor 3, the lower wafer conveyor 4, the upper reticle conveyor 5, and the lower reticle conveyor 6, each include a roller conveyor. Each of the conveyors includes, at an end portion further inside the storage rack, an orientation changing device (not shown) that changes an orientation of the wafer container W or the reticle container R so that the front-rear direction of the wafer container W or the reticle container R is toward the pivotal axis Z.

Similarly, in this embodiment, the container transport conveyors included in the lower structure 1D, i.e., the upper wafer conveyor 7, the lower wafer conveyor 8, and the lower reticle conveyor 9, each include a roller conveyor. Each of the conveyors includes, at an end portion further inside the storage rack, an orientation changing device (not shown) that changes an orientation of the wafer container W or the reticle container R so that the front-rear direction of the wafer container W or the reticle container R is toward the pivotal axis Z.

Although not described in detail, the orientation changing device includes a container support base that can be moved up and down, turned, and moved in the transport direction to change the orientation of the container.

When the container is moved out of storage, the orientation changing device changes the orientation of the container supplied from the container transfer device 2B back to an orientation suitable for transportation by the container transport conveyor, and supplies the container to the container transport conveyor.

(Configuration of Wafer Container)

The wafer container W for storing the semiconductor wafer Wh is an airtight container of synthetic resin that is produced in compliance with the Semiconductor Equipment and Materials International (SEMI) standards, and is typically called a Front Opening Unified Pod (FOUP).

Figure 16:
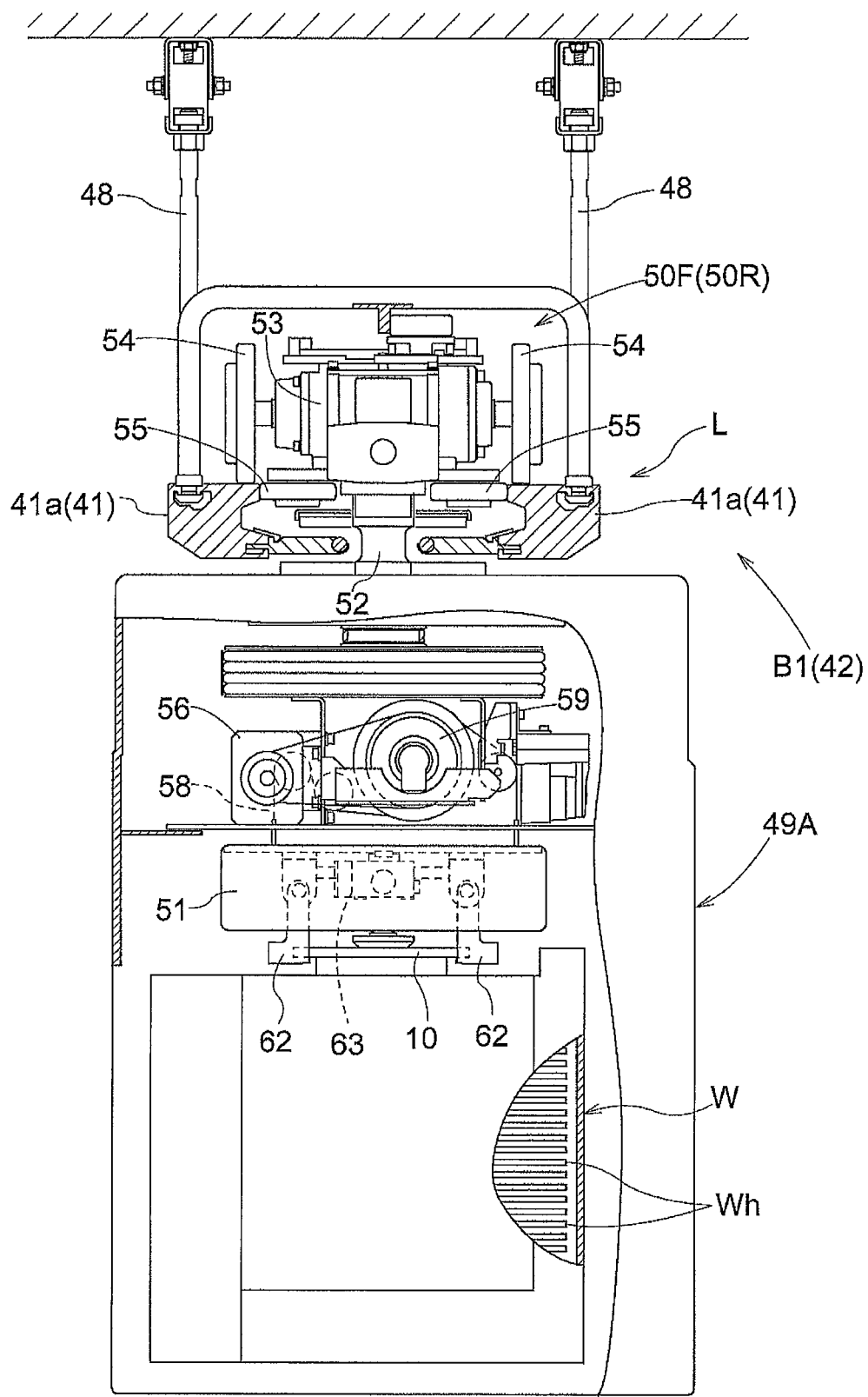
FIG. 16 is a partially cut-away front view of the first overhead transport vehicle.

Although not described in detail, as shown in FIG. 16, the wafer container W is configured to contain a plurality of semiconductor wafers Wh that are vertically arranged one on top of another. The wafer container W has, at an upper portion thereof, a top flange 10 that is to be held by the hoist type first overhead transport vehicle B1. The wafer container W has, in a front surface thereof, an opening that is opened and closed using a lid member that can be removably attached to the wafer container W and through which the substrate is put into or extracted from the wafer container W. The wafer container W also has on its bottom portion three fitting grooves (not shown) to which positioning pins 11 (see FIG. 5) are to be fitted.

(Configuration of Reticle Container)

Figure 17:
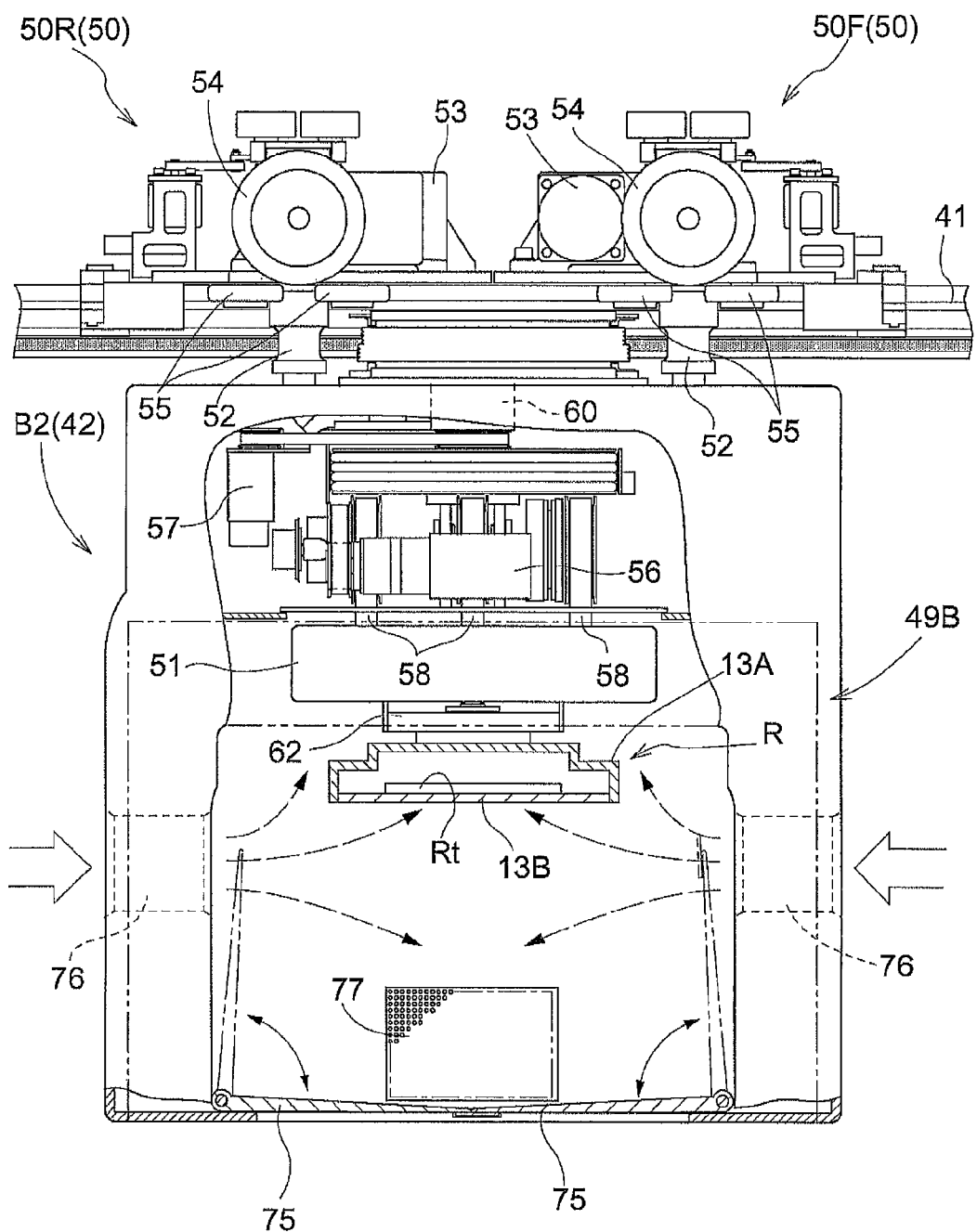
FIG. 17 is a partially cut-away side view of a second overhead transport vehicle.
Figure 18:
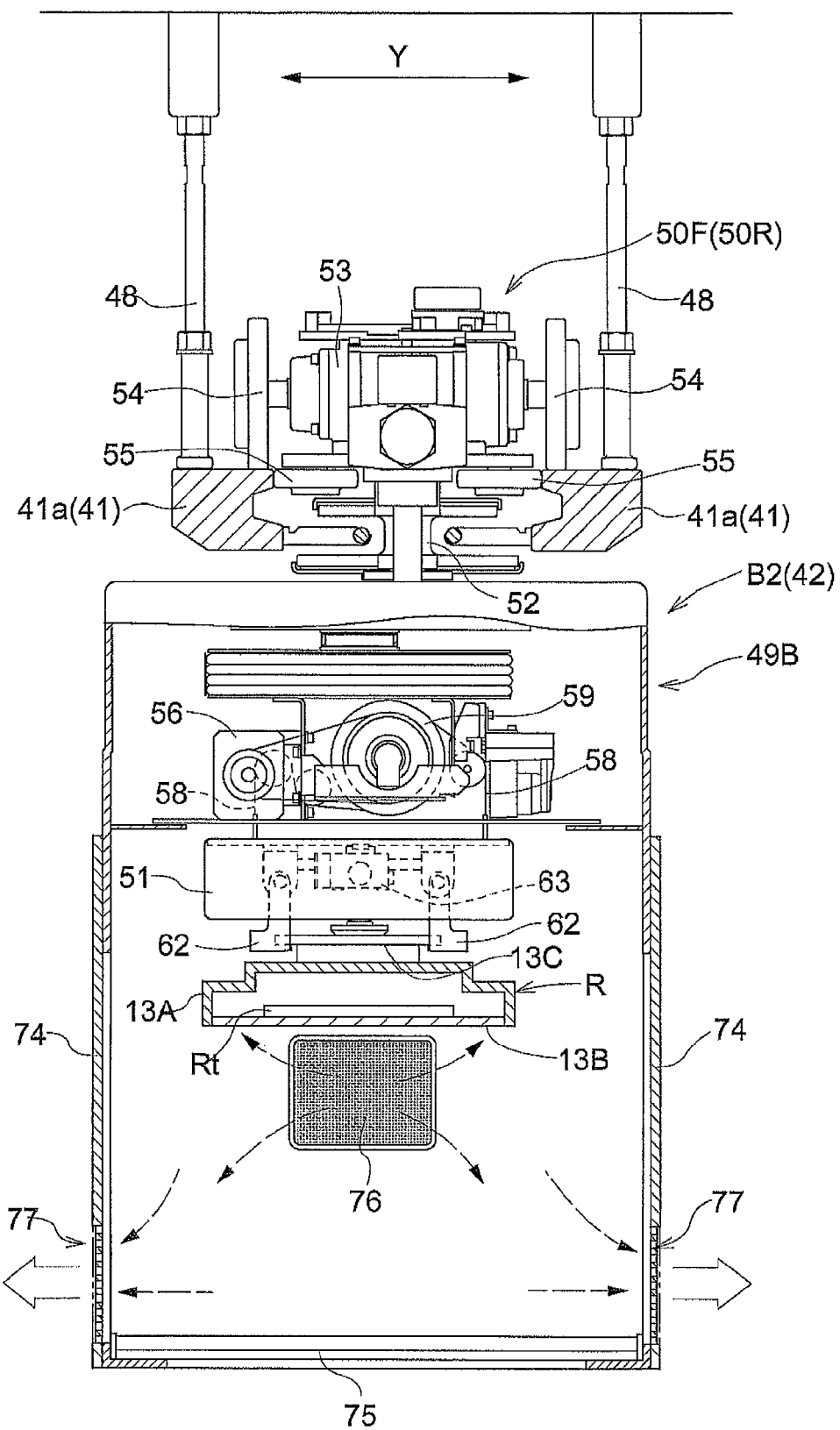
FIG. 18 is a partially cut-away front view of the second overhead transport vehicle.

As shown in FIGS. 17 and 18, the reticle container R for containing the reticle Rt is an airtight container of synthetic resin that includes a main body portion 13A that is open downward (i.e., a bottom portion thereof has an opening), and a lid member 13B that is removably attached to the lower opening of the main body portion 13A. The reticle Rt is placed and supported on an upper surface of the lid member 13B.

The reticle container R has, at an upper portion thereof, a flange portion 13C that is to be held by the hoist type second overhead transport vehicle B2.

The flange portion 13C of the reticle container R has a shape similar to that of the top flange 10 of the wafer container W and the same size as that of the top flange 10 of the wafer container W.

(Configuration of First Accommodation Unit)

Figure 5:
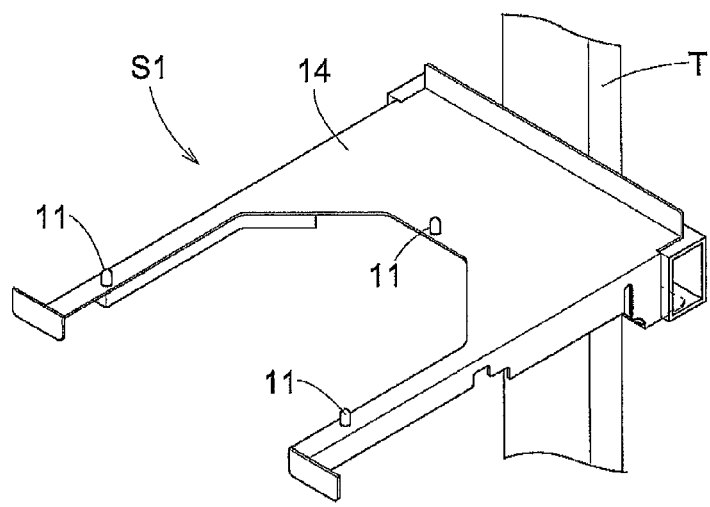
FIG. 5 is a perspective view of a first accommodation unit.
Figure 6:
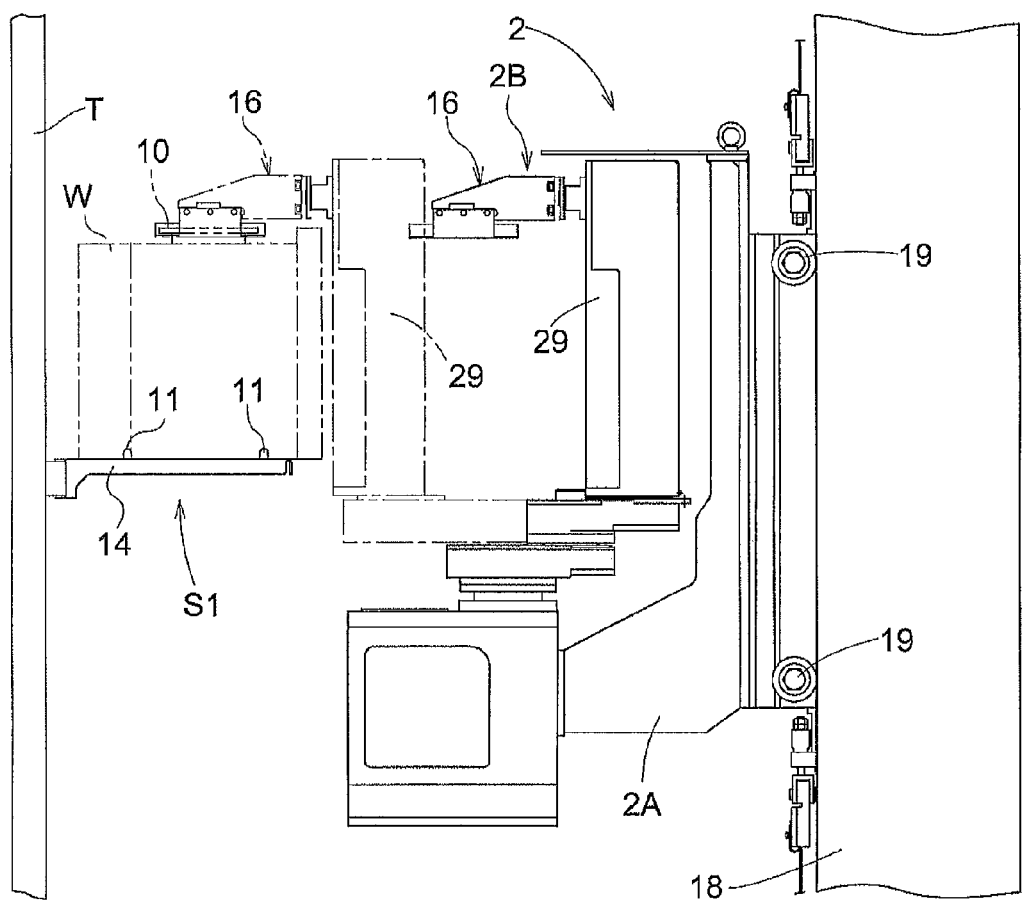
FIG. 6 is a side view of the first accommodation unit storing a wafer container.

As shown in FIGS. 5 and 6, the first accommodation unit S1 includes the three positioning pins 11 at an upper portion of a main body 14 thereof that has a U shape as viewed from above. The main body 14 is attached, at only one end thereof, to a support frame post T.

The wafer container W is placed and supported on the first accommodation unit S1 while the wafer container W is positioned by the three positioning pins 11 (see FIG. 5) of the first accommodation unit S1 are fitted to the fitting grooves (not shown) of the wafer container W.

(Configuration of Second Accommodation Unit)

Figure 7:
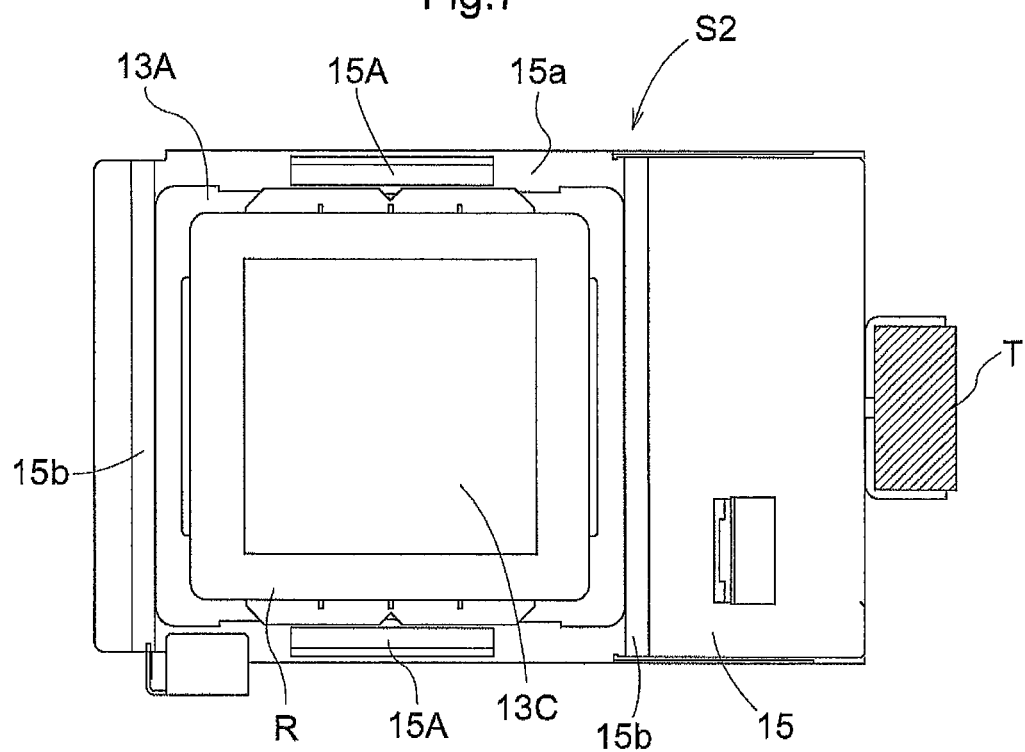
FIG. 7 is a plan view of a second accommodation unit.
Figure 8:
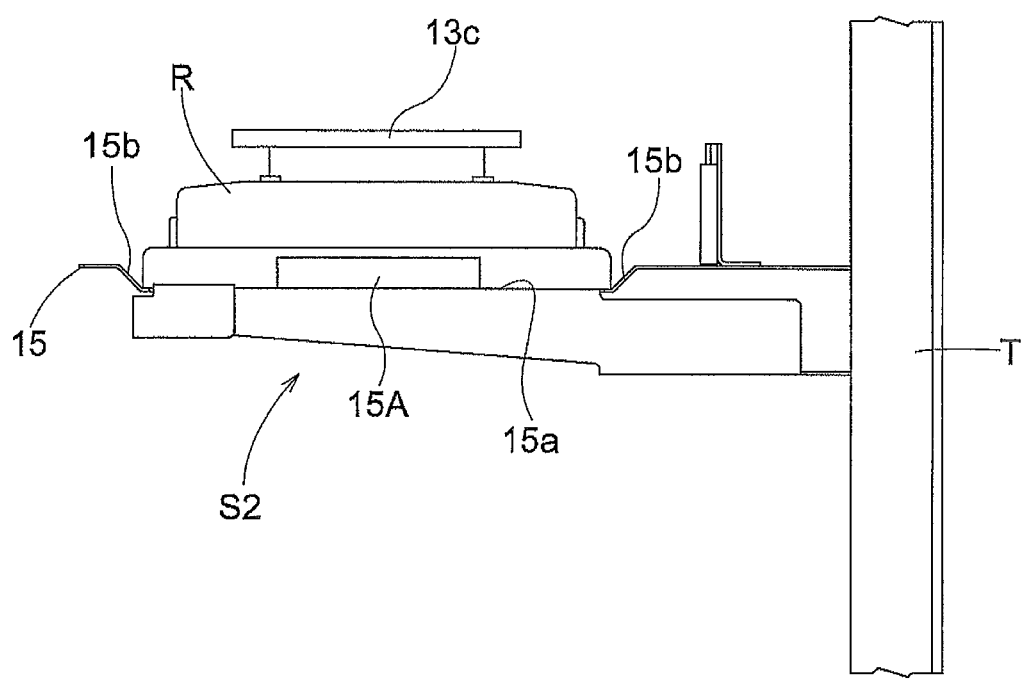
FIG. 8 is a side view of the second accommodation unit.

As shown in FIGS. 7 and 8, the second accommodation unit S2 has an upright receptor 15A protruding upward at each of left and right side edge portions of a main body portion 15 that has a rectangular shape as viewed from above. The main body portion 15 is attached, at only one end thereof, to the support frame post T.

The main body portion 15 has a placement portion 15a on which the reticle container R is to be placed and supported. The placement portion 15a is a hollow portion that is concave downward.

The second accommodation unit S2 supports the reticle container R that is placed on the placement portion 15a. The second accommodation unit S2 positions the reticle container R using sloped portions 15b continuous to ends in the front-rear direction of the placement portion 15a, and the left and right receptors 15A.

(Vertical Transport Apparatus)

As described above, in the vertical transport apparatus 2, as shown in FIGS. 9 to 12, the vertical movement base 2A includes the container transfer device 2B. The container transfer device 2B has a holding unit 16 for supporting the wafer container W in a hanging state (or in a hanging position) by holding the top flange 10 of the wafer container W, and for supporting the reticle container R in a hanging state by holding the flange portion 13C of the reticle container R.

The vertical transport apparatus 2 is configured to transport the wafer container W between the first storage and retrieval unit F1 and the first accommodation unit S1 while supporting the wafer container W in the hanging state, and to transport the reticle container R between the second storage and retrieval unit F2 and the second accommodation unit S2 while supporting the reticle container R in the hanging state. Each portion will be described hereinafter.

Specifically, a guide rail 18 for guiding the vertical movement base 2A and a counterweight 17 in a manner that allows the vertical movement base 2A and the counterweight 17 to move up and down, is provided at a back portion in the storage rack 1, across the lower, middle, and upper structures 1D, 1M, and 1U (see FIGS. 3 and 4).

The vertical movement base 2A is provided at a front portion of the guide rail 18. The vertical movement base 2A includes, at a back portion thereof, a plurality of first wheels 19 for controlling the position in the front-rear direction that rotate about an axis extending in a lateral width direction of the storage rack 1, and a plurality of second wheels 20 for controlling the position in the lateral direction that rotate about an axis extending in a front-rear width direction of the storage rack 1.

The vertical movement base 2A is moved up and down along the guide rail 18 by the first and second wheels 19 and 20 being guided by the guide rail 18.

The counterweight 17 is provided inside the guide rail 18. The counterweight 17 includes a plurality of first rollers 21 that rotate about a diagonal axis extending backward in the front-rear width direction of the storage rack 1 as one progresses inward in the lateral width direction of the storage rack 1, and a plurality of second rollers 22 that rotate about a diagonal axis extending forward in the front-rear width direction of the storage rack 1 as one progresses inward in the lateral width direction of the storage rack 1.

The counterweight 17 is moved up and down along the guide rail 18 by the first and second rollers 21 and 22 being guided by the guide rail 18.

Figure 9:
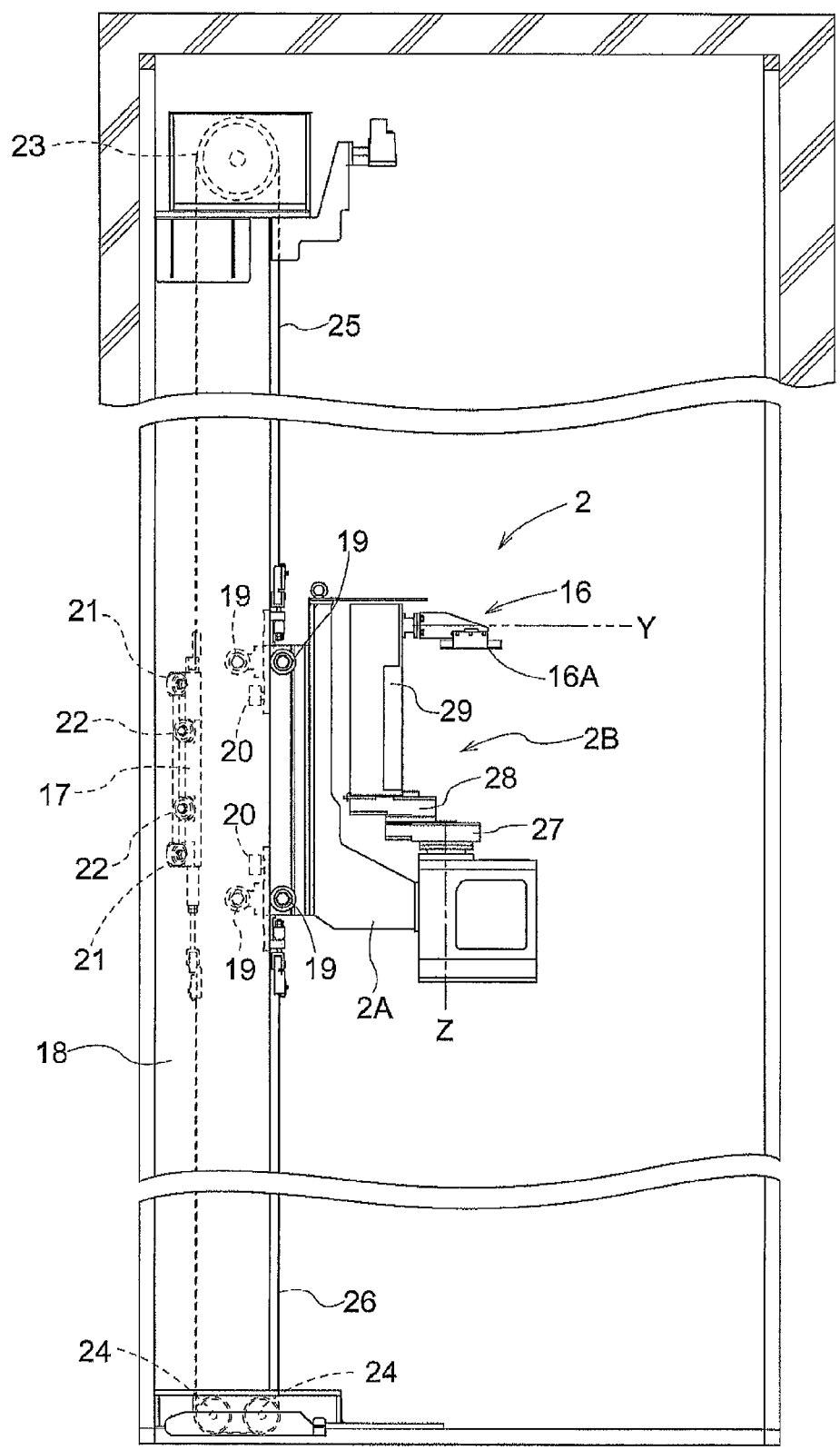
FIG. 9 is a side view of a vertical transport mechanism.

As shown in FIG. 9, the upper structure 1U includes, at an upper portion thereof, a sprocket-like driven rotating member 23 that is driven to rotate in forward and reverse directions. The lower structure 1D includes, at a lower portion thereof, a pair of front and rear idling rotating members 24.

A first vertical movement belt 25 is wrapped and hung around the driven rotating member 23 with both ends thereof extending downward. One end portion of the first vertical movement belt 25 is connected to an upper end portion of the vertical movement base 2A, and the other end portion of the first vertical movement belt 25 is connected to an upper end portion of the counterweight 17.

A second vertical movement belt 26 is wrapped and hung around the pair of idling rotating members 24 with both ends thereof extending upward. One end portion of the second vertical movement belt 24 is connected to a lower end portion of the vertical movement base 2A, and the other end portion of the second vertical movement belt 26 is connected to a lower end portion of the counterweight 17.

Therefore, the vertical movement base 2A is moved up and down along the guide rail 18 by the driven rotating member 23 rotating in forward and reverse directions.

(Configuration of Container Transfer Apparatus)

Figure 12:
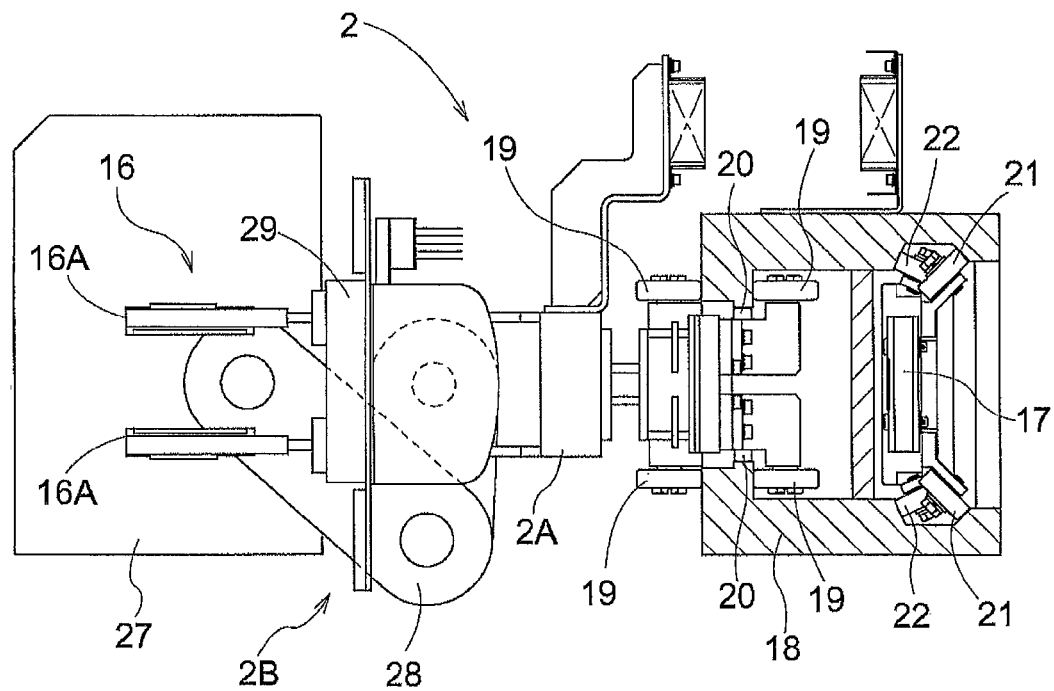
FIG. 12 is a plan view of the vertical transport mechanism.

As shown in FIGS. 9 and 12, the container transfer device 2B includes a turning base 27 that is mounted to the vertical movement base 2A in a manner that allows the turning base 27 to turn about the pivotal axis Z, an extending and retracting link 28 that extends and retracts while being supported by the turning base 27, and a vertical frame member 29 that is supported in an upright position with respect to the extending and retracting link 28. The holding unit 16 is provided at an upper end portion of the vertical frame member 29.

Figure 13:
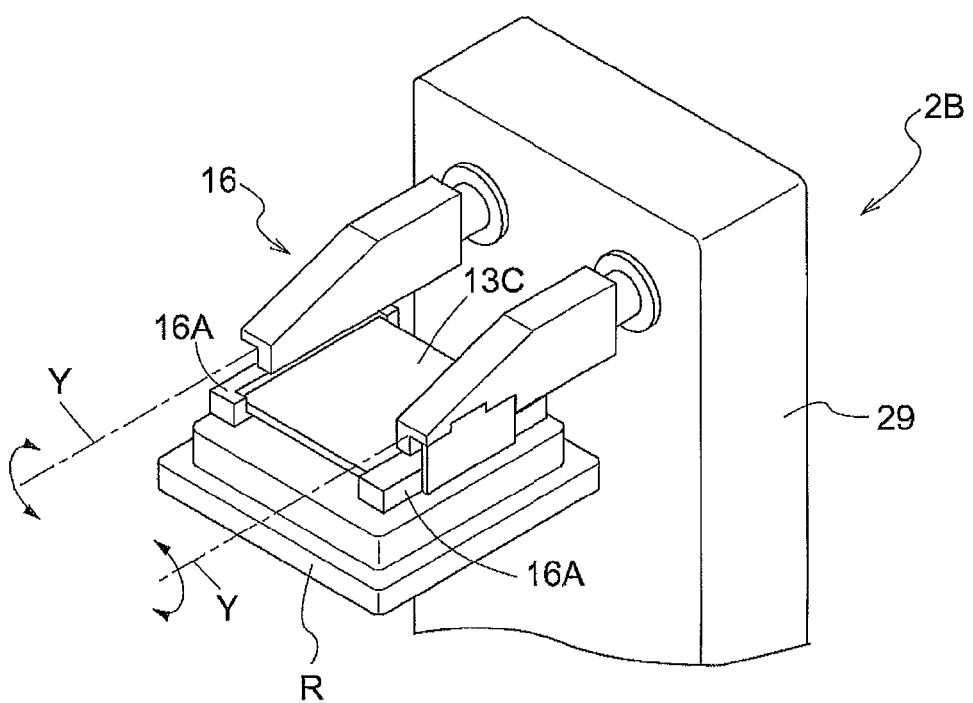
FIG. 13 is a perspective view of a holding unit holding a reticle container.

As shown in FIG. 13, the holding unit 16 includes a pair of holding claw portions 16A that rotate in forward and reverse directions about a rotation axis Y extending in a direction in which the extending and retracting link 28 extends and retracts. The container is held or released by the pair of holding claw portions 16A being closed or opened.

Therefore, the container transfer device 2B is configured to select an object to be transferred (i.e., the wafer container W or the reticle container R) by turning about the pivotal axis Z, and transfer the object to be transferred by the extension or retraction of the extending and retracting link 28, the opening or closing of the holding unit 16, and the vertical movement of the vertical movement base 2A while holding the object to be transferred in the hanging state.

A transfer process of the container transfer device 2B that is performed when the wafer container W is transferred from the first accommodation unit S1 to the first storage and retrieval unit F1, will be described. Initially, the container transfer device 2B is turned about the pivotal axis Z so that the holding unit 16 faces the first accommodation unit S1 (an object to be transferred). Next, the holding unit 16 is positioned above the wafer container W by extension of the extending and retracting link 28.

Thereafter, the vertical movement base 2A is moved down so that the open holding unit 16 is moved down to a position suitable for holding the top flange 10 of the wafer container W, and then, the holding unit 16 is closed to hold the top flange 10 of the wafer container W (see FIG. 6).

Next, the vertical movement base 2A is moved up so that the wafer container W is supported in the hanging state, and then, the wafer container W is pulled back to a position above the vertical movement base 2A by retraction of the extending and retracting link 28.

Thereafter, the vertical movement base 2A is moved up or down so that the wafer container W is moved up or down to a height corresponding to the first storage and retrieval unit F1 (transfer destination), and is turned about the pivotal axis Z so that the holding unit 16 faces the first storage and retrieval unit F1 (transfer destination).

Next, the holding unit 16 is positioned above the first storage and retrieval unit F1 by extension of the extending and retracting link 28, and thereafter, the vertical movement base 2A is moved down so that the wafer container W is supplied to the first storage and retrieval unit F1.

After the wafer container W is supplied to the first storage and retrieval unit F1, the holding unit 16 is opened, the vertical movement base 2A is then moved up so that the holding unit 16 is moved up, and the holding unit 16 is then pulled back by retraction of the extending and retracting link 28.

According to the foregoing description of the transfer process, i.e., the process of transferring the wafer container W from the first accommodation unit S1 to the first storage and retrieval unit F1, it will also be understood how the wafer container W is transferred from the first storage and retrieval unit F1 to the first accommodation unit S1, how the reticle container R is transferred from the second accommodation unit S2 to the second storage and retrieval unit F2, and how the reticle container R is transferred from the second storage and retrieval unit F2 to the second accommodation unit S2, and therefore, these transfer processes will not be described.

Incidentally, in this embodiment, the height of the holding unit 16 is set by the vertical movement base 2A being moved up and down so that the open holding unit 16 located above the container is moved down to a position suitable for holding the container by the same distance both when the wafer container W is held and when the reticle container R is held.

(Container Discriminating Sensor)

Figure 10:
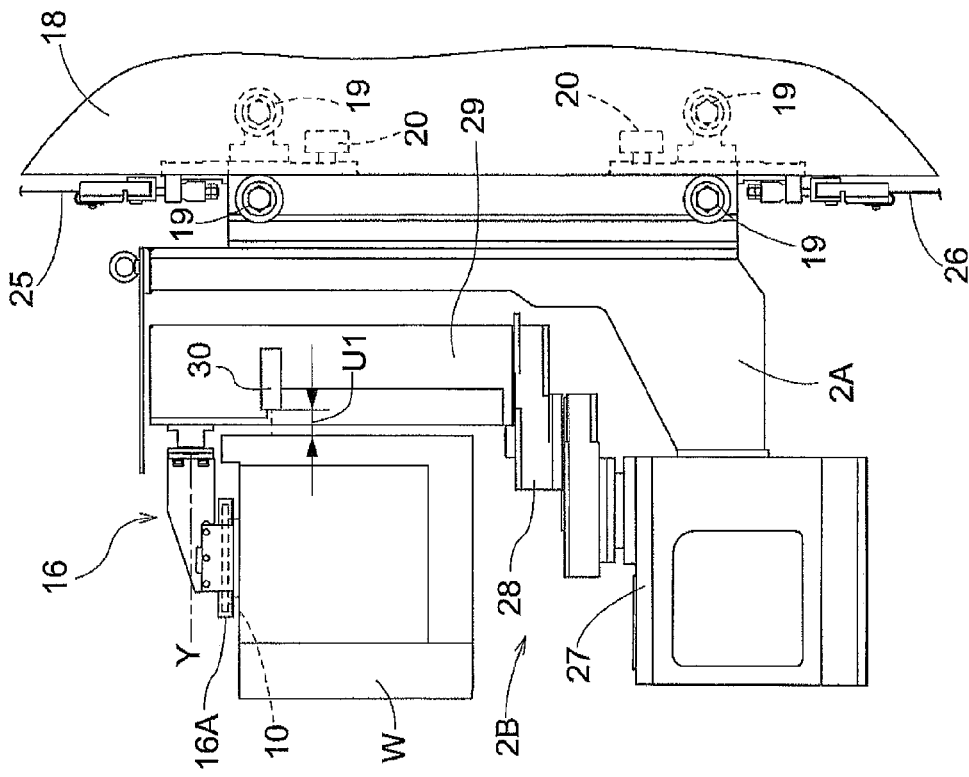
FIG. 10 is a side view of the vertical transport mechanism holding a wafer container.
Figure 11:
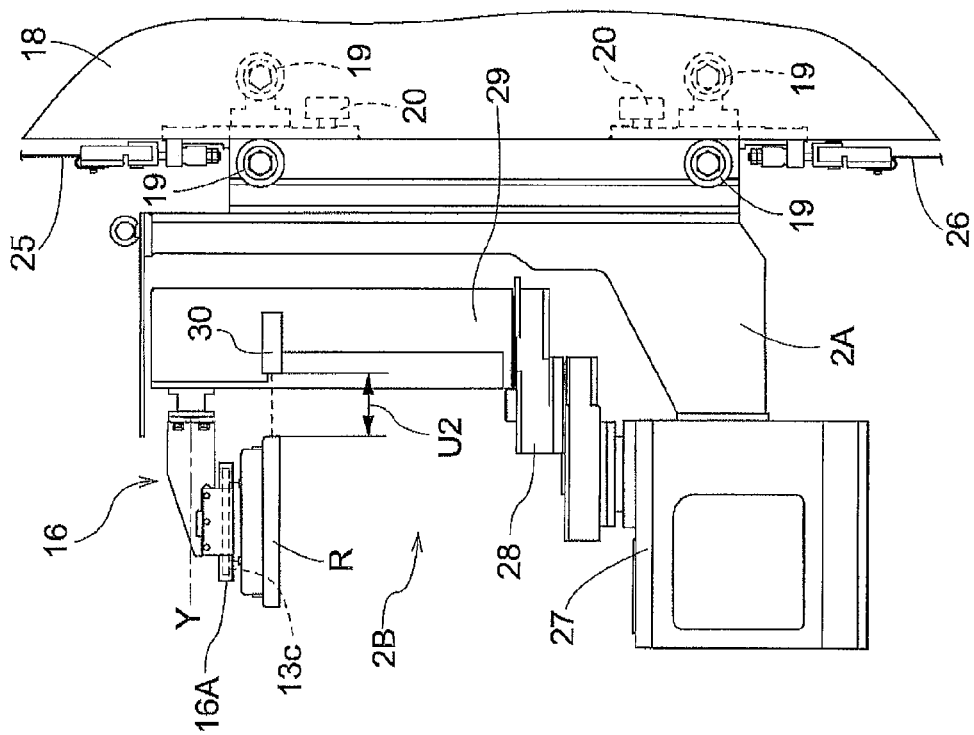
FIG. 11 is a side view of the vertical transport mechanism holding a reticle container.

As shown in FIGS. 10 and 11, the vertical transport apparatus 2 includes a container discriminating sensor 30 for determining whether or not the holding unit 16 is holding the wafer container W and whether or not the holding unit 16 is holding the reticle container R.

Specifically, in this embodiment, the container discriminating sensor 30 includes a distance sensor, such as a laser distance measuring sensor or the like, and is attached to the vertical frame member 29.

The container discriminating sensor 30 is configured to detect a distance to the container held by the holding unit 16.

Specifically, when the holding unit 16 is holding the wafer container W, the container discriminating sensor 30 detects a first distance U1 corresponding to the wafer container W.

When the holding unit 16 is holding the reticle container R, the container discriminating sensor 30 detects a second distance U2 corresponding to the reticle container R.

Because the reticle container R has a smaller outer shape than that of the wafer container W, the second distance U2 has a larger value than that of the first distance U1. Therefore, based on the distance detected by the container discriminating sensor 30, it can be determined whether or not the holding unit 16 is holding the wafer container W and whether or not the holding unit 16 is holding the reticle container R.

Incidentally, although not shown, the information detected by the container discriminating sensor 30 is output to a facility management control unit. The facility management control unit determines, based on the information detected by the container discriminating sensor 30, whether or not the holding unit 16 is holding the wafer container W and whether or not the holding unit 16 is holding the reticle container R.

Note that the container discriminating sensor 30 is configured to output information indicating a distance that is larger than the second distance U2 when the holding unit 16 is not holding the wafer container W or the reticle container R. The facility management control unit can determine the absence of the container held by the holding unit 16 based on the information detected by the container discriminating sensor 30.

Specifically, if a power failure or the like occurs, then when the operation of the facility is subsequently resumed, the facility management control unit determines, based on the information detected by the container discriminating sensor 30, whether or not the holding unit 16 is holding the wafer container W, whether or not the holding unit 16 is holding the reticle container R, or whether or not the holding unit 16 is not holding a container, thereby determining an appropriate operating state for the vertical transport apparatus 2.

(Overall Configuration of Article Transport Facility)

On the third level of the building, a process facility is provided that processes the semiconductor wafer Wh while transporting the wafer container W and the reticle container R using the first and second overhead transport vehicles B1 and B2. On the first level of the building, another process facility is provided that processes the semiconductor wafer Wh while transporting the wafer container W using the first overhead transport vehicle B1.

The article transport facility provided on the third level of the building will be described hereinafter.

Figure 14:
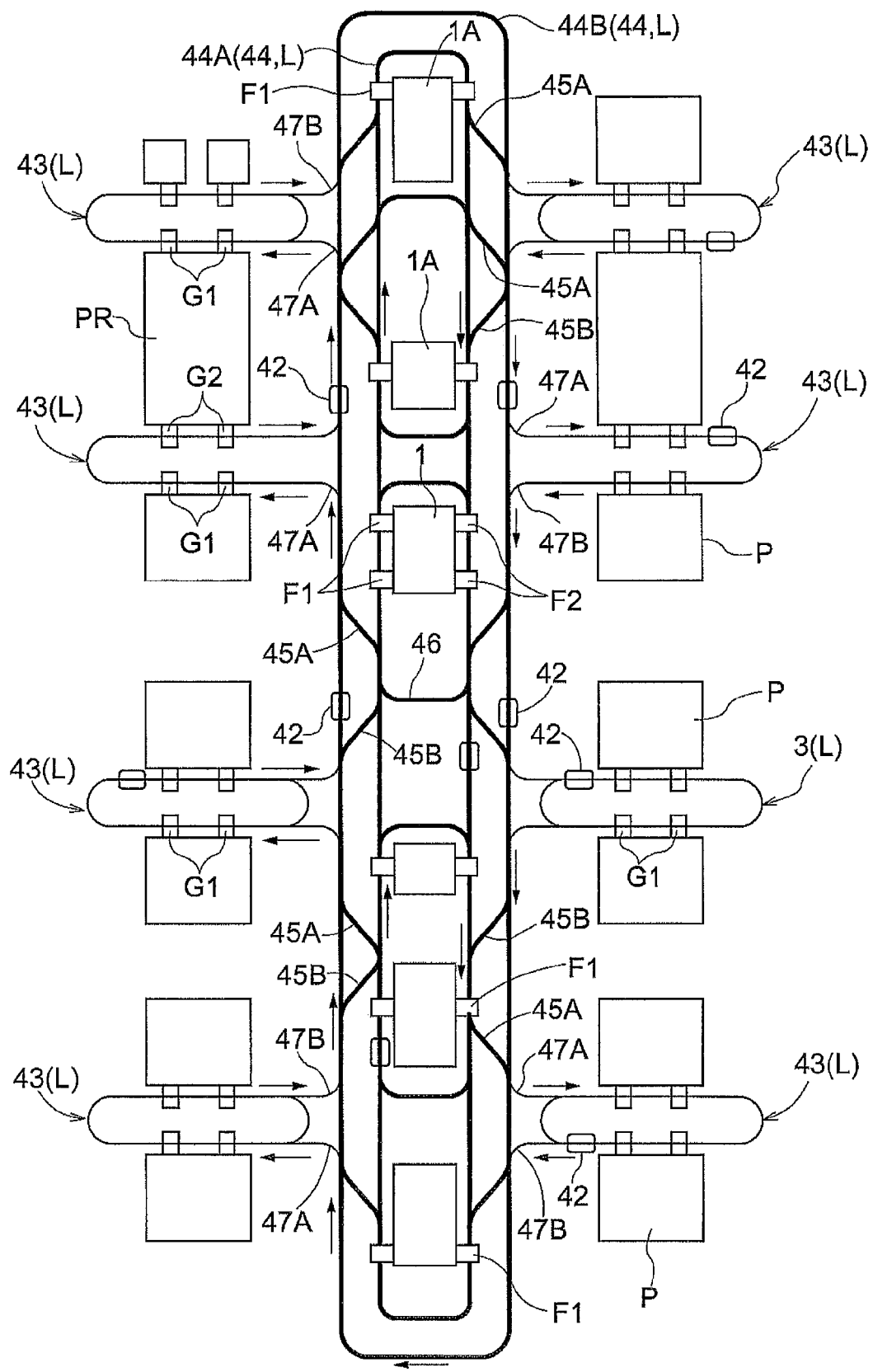
FIG. 14 is a plan view of transport paths of an article transport facility.

Specifically, as shown in FIG. 14, a portion of travel paths L for the first and second overhead transport vehicles B1 and B2 is a common travel path portion La (see FIG. 19) on which both the first and second overhead transport vehicles B1 and B2 travel.

Figure 15:
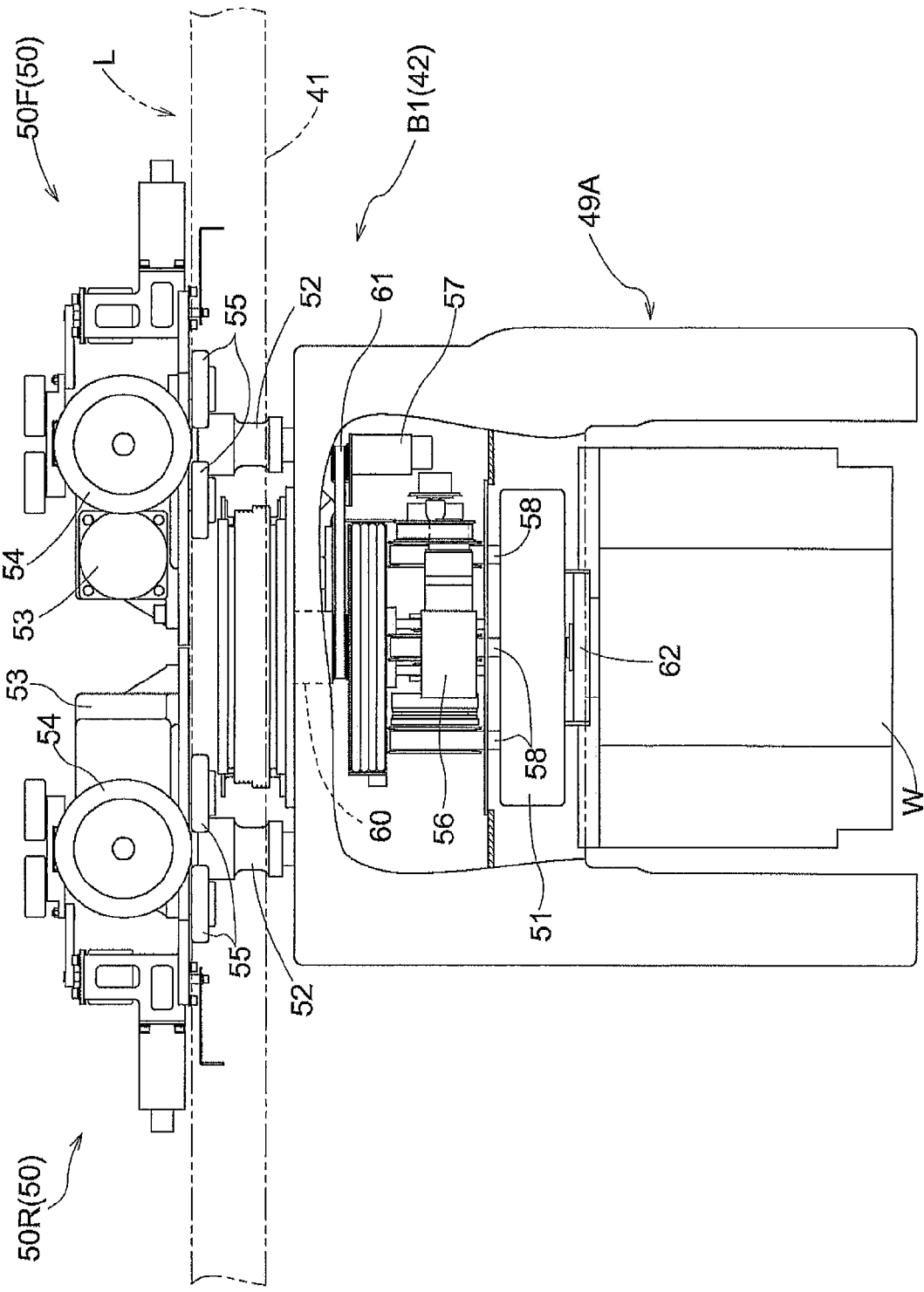
FIG. 15 is a side view of a first overhead transport vehicle.

As shown in FIGS. 15 and 16, travel rails 41 are provided along the travel paths L on a ceiling side of the third level. The first and second overhead transport vehicles B1 and B2 are configured to travel along the travel rails 41.

Incidentally, as described above, the first overhead transport vehicle B1 transports the wafer container W, and the second overhead transport vehicle B2 transports the reticle container R.

In the description that follows, when it is not necessary to distinguish between the first and second overhead transport vehicles B1 and B2, the first and second overhead transport vehicles B1 and B2 are simply described as container transport vehicles 42.

As shown in FIG. 14, the travel paths L include a plurality of loop-like sub-travel paths 43 each of which passes through a corresponding wafer processing apparatus P, and two loop-like main travel paths 44.

The two loop-like main travel paths 44 are arranged in a path lateral width direction to form a double loop. The container transport vehicles 42 travel on the main travel paths 44 in the same direction. Note that, in FIG. 14, the travel direction of the container transport vehicles 42 is indicated by an arrow.

Incidentally, the two loop-like main travel paths 44 are each in the shape of a rectangle having four rounded corners as viewed from above.

In the description that follows, the inner one of the pair of main travel paths 44 in the double loop is referred to as a first main travel path 44A, and the outer one is referred to as a second main travel path 44B. When it is not necessary to distinguish between the two main travel paths 44, the two main travel paths 44 are simply described as main travel paths 44.

First branch paths 45A via which the container transport vehicle 42 switches from the first main travel path 44A to the second main travel path 44B, and second branch paths 45B via which the container transport vehicle 42 switches from the second main travel path 44B to the first main travel path 44A, are provided between the pair of main travel paths 44 in the double loop.

The first and second branch paths 45A and 45B, which are diagonal with respect to the main travel paths 44 as viewed from above, connect the first and second main travel paths 44A and 44B together.

A plurality of short-cut paths 46 via which the container transport vehicle 42 takes a short-cut from one of a pair of left and right longer-side portions of the first main travel path 44A to the other, are provided between the left and right longer-side portions of the first main travel path 44A, along the longitudinal direction of the first main travel path 44A.

The loop-like sub-travel paths 43 are in the shape of a generally ellipse that includes a pair of parallel straight lines with ends on each side connected together by an arc portion. The loop-like sub-travel paths 43 are provided on both sides of the two loop-like main travel paths 44, and are oriented with the longitudinal direction thereof being perpendicular to the longitudinal direction of the main travel paths 44 and are arranged with spaces therebetween along the longitudinal direction of the main travel paths 44, as viewed from above.

A branch connection path 47A is provided via which the container transport vehicle 42 travels from the second main travel path 44B of the pair of main travel paths 44 to the sub-travel path 43 (i.e., the branch connection path 47A branches off from the second main travel path 44B). A merge connection path 47B is provided via which the container transport vehicle 42 travels from the sub-travel path 43 to the second main travel path 44B (i.e., the merge connection path 47B joins the second main travel path 44B).

In this embodiment, as shown in FIG. 14, the storage rack 1 for storing the wafer container W and the reticle container R, and a plurality of wafer-only storage racks 1A for temporarily storing the wafer container W, are provided in respective corresponding portions inside the first main travel path 44A, and are arranged in a line along the longitudinal direction of the first main travel path 44A.

The wafer processing apparatuses P are of different types that perform different processes on the semiconductor substrate, including an exposure process apparatus PR.

Although FIG. 14 illustrates an example in which the single storage rack 1 and the single exposure process apparatus PR are provided, the numbers of the storage racks 1 and the exposure process apparatuses PR may be variously changed.

As described above, the storage rack 1 for storing the wafer container W and the reticle container R includes the first storage and retrieval unit F1 for the wafer container W and the second storage and retrieval unit F2 for the reticle container R.

The wafer-only storage racks 1A for storing the wafer container W include the first storage and retrieval unit F1 for the wafer container W.

The exposure process apparatus PR includes a wafer input and output unit G1 for the wafer container W and a reticle input and output unit G2 for the reticle container R. The other wafer processing apparatuses P include the wafer input and output unit G1 for the wafer container W.

Therefore, the first overhead transport vehicle B1 as the container transport vehicle 42 performs the process of transporting the wafer container W received from the first storage and retrieval unit F1 of the storage rack 1 or the wafer-only storage rack 1A to the wafer input and output unit G1 of the wafer processing apparatus P or the exposure process apparatus PR, the process of transporting the wafer container W received from the wafer input and output unit G1 of the wafer processing apparatus P or the exposure process apparatus PR to the wafer input and output unit G1 of another wafer processing apparatus P that performs a different process, and the process of transporting the wafer container W received from the wafer input and output unit G1 of the wafer processing apparatus P or the exposure process apparatus PR to the first storage and retrieval unit F1 of the storage rack 1 or the wafer-only storage rack 1A.

The second overhead transport vehicle B2 as the container transport vehicle 42 performs the process of transporting the reticle container R received from the second storage and retrieval unit F2 of the storage rack 1 to the reticle input and output unit G2 of the exposure process apparatus PR, and the process of transporting the reticle container R received from the reticle input and output unit G2 of the exposure process apparatus PR to the second storage and retrieval unit F2 of the storage rack 1.

Figure 19:
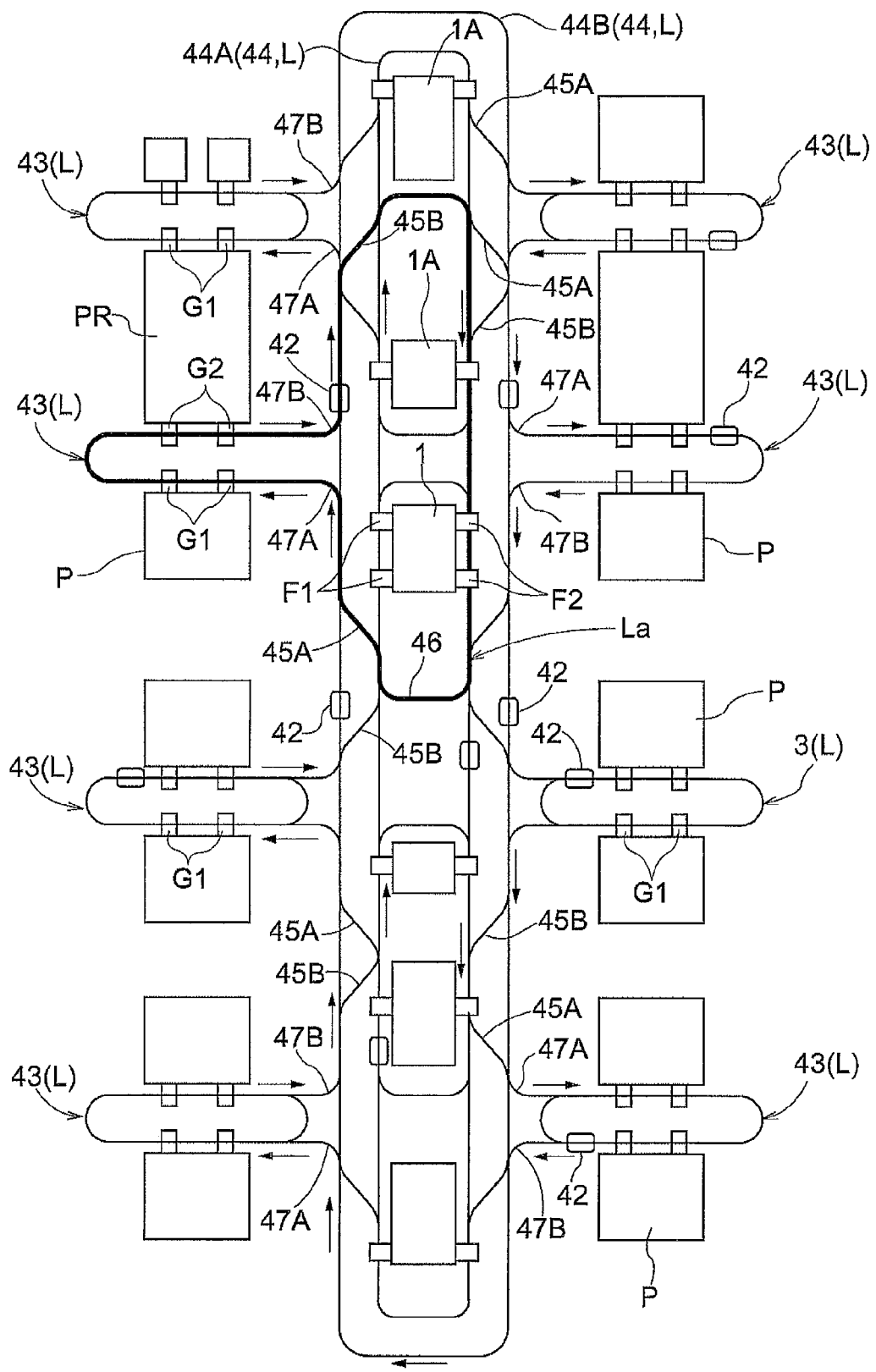
FIG. 19 is a plan view of transport paths for a reticle container.

As shown in FIG. 19, for example, a main transport path on which the second overhead transport vehicle B2 mainly travels to transport the reticle container R is a path from the second storage and retrieval unit F2 of the storage rack 1 as a starting point, through the first main travel path 44A, the short-cut path 46, the first branch path 45A, the second main travel path 44B, the branch connection path 47A, and the sub-travel path 43, to the reticle input and output unit G2 of the exposure process apparatus PR.

As shown in FIG. 19, for example, another main transport path is a path from the reticle input and output unit G2 as a starting point, through the sub-travel path 43, the merge connection path 47B, the second main travel path 44B, the second branch path 45B, the short-cut path 46, and the first main travel path 44A, to the second storage and retrieval unit F2 of the storage rack 1.

The main transport path for the second overhead transport vehicle B2 is a path portion on which the first overhead transport vehicle B1 travels to transport the wafer container W, and therefore, corresponds to the common travel path portion La of the travel paths L on which both the first and second overhead transport vehicles B1 and B2 travel.

Note that, in this illustrative embodiment, the second overhead transport vehicle B2 travels on only the common travel path portion La to transport the reticle container R. Alternatively, the travel paths L may include a path on which only the second overhead transport vehicle B2 travels.

For example, FIGS. 14 and 19 illustrate an example in which the sub-travel path 43 passing through the reticle input and output unit G2 of the exposure process apparatus PR passes through the wafer input and output unit G1 of the wafer processing apparatus P. If the wafer processing apparatus P is removed, only the second overhead transport vehicle B2 travels on the sub-travel path 43 passing through the reticle input and output unit G2 of the exposure process apparatus PR, and this sub-travel path 43 is not included in the common travel path portion La.

Next, a configuration of each unit or portion will be described.

(Configuration of Travel Rail) The travel rails 41 provided along the travel paths L extend along the main travel path 44 and the sub-travel path 43. As shown in FIG. 16, the travel rail 41 is supported by a travel rail support 48, hanging from the ceiling portion. The travel rail 41 includes a pair of left and right rail portions 41a arranged with a space in a rail lateral width direction.

(Configuration of First Overhead Transport Vehicle)

As shown in FIGS. 15 and 16, the first overhead transport vehicle B1 of the container transport vehicles 42 includes a vehicle main body portion 49A that is located below the travel rail 41, and a traveling unit 50 that travels along the travel rail 41. The vehicle main body portion 49A includes a holding unit 51 for holding an article B in a hanging state.

The traveling unit 50 includes a front traveling unit 50F and a rear traveling unit 50R that are arranged in a line in the front-rear direction. Vertical link shafts 52 each extending downward from a corresponding one of the front and rear traveling units 50F and 50R extend downward through between the pair of left and right rail portions 41a.

The vehicle main body portion 49A is supported by the link shafts 52 of the front and rear traveling units 50F and 50R in a manner that allows the vehicle main body portion 49A to relatively rotate about the axes of the link shafts 52.

Each of the front and rear traveling units 50F and 50R includes a left and a right traveling wheel 54 that are driven to rotate by an electric drive motor 53. The left and right traveling wheels 54 travel on travel surfaces that are upper surfaces of the pair of left and right rail portions 41a, respectively. Each of the front and rear traveling units 50F and 50R also includes a left and a right guide wheel 55 that freely rotate about a vertical axis. The left and right guide wheels 55 abut guide surfaces that are inner side surfaces of the pair of left and right rail portions 41a, respectively.

Therefore, the first overhead transport vehicle B1 is configured to travel along the travel rail 41 by the traveling wheels 54 of the front and rear traveling units 50F and 50R being driven to rotate while a position thereof in the vehicle lateral width direction is controlled by the guide wheels 55 of the front and rear traveling units 50F and 50R being guided by the pair of rail portions 41a.

The first overhead transport vehicle B1 can satisfactorily travel through arc-like path portions, such as the arc-like portions of the main travel path 44 and the sub-travel path 43 and the like, by the front and rear traveling units 50F and 50R being bent about the respective link shafts 52 with respect to the vehicle main body portion 49A.

As shown in FIG. 15, the vehicle main body portion 49A has an inverted-U shape in which a front end portion and a rear end portion thereof in the vehicle front-rear direction extend downward from an upper wall portion thereof, as viewed in the vehicle lateral width direction. The vehicle main body portion 49A is open downward and both leftward and rightward. The holding unit 51 is provided between the front and rear end portions extending downward.

The vehicle main body portion 49A includes an electric vertical movement motor 56 for moving the holding unit 51 up and down, and an electric turning motor 57 for turning the holding unit 51 about a vertical axis.

Specifically, the vertical movement motor 56 drives and rotates a rotating drum 59 around that a belt (band-like member) 58 is wrapped, in forward and reverse directions, to wind and unwind the belt 58, thereby moving the holding unit 51 up and down to an upper position and a lower position.

Note that, as shown in FIGS. 15 and 16, the upper position is a position where the holding unit 51 is accommodated in an upper inner portion of the vehicle main body portion 49A, and the lower position is a position where the holding unit 51 is lowered close to the wafer input and output units G1 of the wafer processing apparatus P and the exposure process apparatus PR, or the first storage and retrieval units F1 of the storage rack 1 and the wafer-only storage rack 1A.

The holding unit 51 is linked to the vehicle main body portion 49A via a turning shaft 60 (see FIG. 15) extending downward from the upper wall portion of the vehicle main body portion 49A in a manner that allows the holding unit 51 to rotate about the vertical axis. A turning motor 57 drives and rotates the turning shaft 60 about a vertical axis via a rotational drive power transmitting unit 61, whereby the holding unit 51 is turned about the vertical axis.

As shown in FIG. 16, the holding unit 51 includes a pair of holding tools 62 for holding the top flange 10 of the wafer container W. The pair of holding tools 62 can be opened and closed by swinging about an axis along the front-rear direction of the vehicle main body portion 49A. An electric holding motor 63 is used to switch the pair of holding tools 62 between a state in which the pair of holding tools 62 is closed to hold the top flange 10 and a state in which the pair of holding tools 62 is opened to release the top flange 10. FIG. 16 shows the state in which the pair of holding tool 62 is closed to hold the top flange 10.

(Configuration of Second Overhead Transport Vehicle)

As shown in FIGS. 17 and 18, the second overhead transport vehicle B2 of the container transport vehicles 42 includes a traveling unit 50 that has the same configuration as that of the traveling unit 50 of the first overhead transport vehicle B1, and a vehicle main body portion 49B that has a configuration different from that of the vehicle main body portion 49A of the first overhead transport vehicle B1. The second overhead transport vehicle B2 has a configuration generally similar to that of the first overhead transport vehicle B1, and therefore, the same members as those of the first overhead transport vehicle B1 are indicated by the same reference characters and will not be described in detail.

Specifically, the vehicle main body portion 49B is supported in the handing position via the link shafts 52 by the front and rear traveling units 50F and 50R of the traveling unit 50.

A holding unit 51 that has the same configuration as that of the holding unit 51 of the first overhead transport vehicle B1 is mounted in an interior of the vehicle main body portion 49B.

The holding unit 51 is configured to use an electric holding motor 63 to switch between a state in which the flange portion 13C of the reticle container R is held by a pair of holding tools 62 for holding the flange portion 13C and a state in which the flange portion 13C is released from the pair of holding tools 62. FIG. 18 shows the holding unit 51 that has been switched to the state in which the flange portion 13C of the reticle container R is held by the pair of holding tools 62.

Similar to the first overhead transport vehicle B1, the holding unit 51 is moved up and down by a vertical movement motor 56, and is turned by a turning motor 57.

Similar to the vehicle main body portion 49A of the first overhead transport vehicle B1, the vehicle main body portion 49B of the second overhead transport vehicle B2 has an inverted-U shape in which a front end portion and a rear end portion thereof in the vehicle front-rear direction extend downward from an upper wall portion thereof, as viewed in the vehicle lateral width direction. The vehicle main body portion 49B is open downward and both leftward and rightward. The second overhead transport vehicle B2 includes a pair of plate-like members 74 that close the openings on both the left and right sides of the vehicle main body portion 49B, and a pair of plate-like lid members 75 that close the opening on the bottom side of the vehicle main body portion 49B.

As shown in FIG. 18, the pair of plate-like members 74 are fixed to the vehicle main body portion 49B, closing the openings on both left and right sides of the vehicle main body portion 49B.

The pair of plate-like lid members 75 are configured to swing vertically to switch between a closed position in which the pair of plate-like lid members 75 close the opening on the bottom side of the vehicle main body portion 49B and an open position in which the pair of plate-like lid members 75 open the opening on the bottom side of the vehicle main body portion 49B. The pair of plate-like lid members 75 are opened and closed by an open and close drive device (not shown).

Therefore, when the holding unit 51 is moved up and down, the pair of plate-like lid members 75 are operated into the open position to open the opening on the bottom side of the vehicle main body portion 49B. When the holding unit 51 is located inside the vehicle main body portion 49B, the pair of plate-like lid members 75 are operated into the closed position to close the opening on the bottom side of the vehicle main body portion 49B, thereby preventing or reducing entry of dust or the like from the outside.

A clean air supply device 76 for supplying clean air into the vehicle main body portion 49B is mounted to a front or rear wall portion of the vehicle main body portion 49B. An air discharge device 77 that can adjust the amount of air discharged is mounted to the pair of plate-like members 74.

Therefore, the clean air supply device 76 supplies clean air into the vehicle main body portion 49B while the air discharge device 77 discharges air from the vehicle main body portion 49B, whereby the interior of the vehicle main body portion 49B is filled with clean air, so that the reticle container R, or the reticle Rt inside the reticle container R, can be maintained clean.

Incidentally, the first and second overhead transport vehicles B1 and B2 (i.e., the container transport vehicles 42) include a vehicle control unit (not shown) that controls traveling of the first and second overhead transport vehicles B1 and B2 by controlling traveling of the front and rear traveling units 50F and 50R, vertical movement of the holding unit 51, opening and closing of the pair of holding tools 62, and the like.

The vehicle control unit is configured to receive a transport command specifying a transport origin and a transport destination from the facility management control unit, which manages routes of the transport vehicles 42, via wireless communication or the like, and in response to the transport command, perform a transport process of transporting the wafer container W or the reticle container R from the transport origin to the transport destination that are specified by the transport command.

Specifically, the container transport vehicle 42 includes various sensors, such as a sensor for detecting a target stop position corresponding to the transport destination or the transport origin, a distance sensor for detecting a travel distance from a reference point of the container transport vehicle 42, and the like.

The vehicle control unit is configured to control traveling of the front and rear traveling units 50F and 50R to allow the front and rear traveling units 50F and 50R to travel to the specified transport origin or from the transport origin to the specified transport destination, based on information detected by the sensors. At the transport origin, the vehicle control unit controls vertical movement of the holding unit 51 and opening and closing of the pair of holding tools 62 to receive the wafer container W or the reticle container R from the transport origin. At the transport destination, the vehicle control unit controls vertical movement of the holding unit 51 and opening and closing of the pair of holding tools 62 to unload the wafer container W or the reticle container R to the transport destination.

As described above, in this embodiment, the wafer container W and the reticle container R are stored in the storage rack 1, and the vertical transport apparatus 2 as a storage and retrieval transport apparatus includes the holding unit 16 for holding the top flange 10 of the wafer container W and the flange portion 13C of the reticle container R, and the wafer container W and the reticle container R are moved into or out of storage by the vertical transport apparatus 2 while being supported in the hanging state. Therefore, the efficiency of the storage and retrieval process can be improved, and in addition, the configuration of the vertical transport apparatus 2 can be simplified.

The storage rack 1 for storing the wafer container W and the reticle container R is provided, extending from the first level to the third level of the building, and a first-level portion and a third-level portion of the building are used as space for installation of the article transport facility. Therefore, the installation space of the article transport facility as viewed from above can be reduced.

Moreover, at least a portion of the travel paths L of the first overhead transport vehicle B1 for transporting the wafer container W and the second overhead transport vehicle B2 for transporting the reticle container R is used as the common travel path portion La on which both of the first and second overhead transport vehicles B1 and B2 travel, and the first and second overhead transport vehicles B1 and B2 are allowed to travel on the travel rail 41 provided on the ceiling side along the travel paths L. Therefore, the overall length of the travel rails 41 for allowing the first and second overhead transport vehicles B1 and B2 to travel can be reduced, resulting in a decrease in the installation cost of the entire facility.

[Other Embodiments]

Next, other embodiments will be described.

(1) In the above illustrative embodiment, the storage rack 1 for storing the wafer container W and the reticle container R is provided, extending from the first level to the third level of the building, and the wafer container W and the reticle container R are stored in the first-level and third-level portions of the building. The specific configuration of the storage rack 1 can be variously changed.

For example, the storage rack 1 may be configured so that the first accommodation units S1 for accommodating the wafer container W may be arranged in a matrix (in the vertical and horizontal directions), and the second accommodation units S2 for accommodating the reticle container R may be arranged in a matrix (in the vertical and horizontal directions).

In this case, as the storage and retrieval transport apparatus, a so-called stacker crane may be provided that includes a traveling vehicle that travels in a rack lateral width direction, and a vertical movement base that is mounted to a vertical movement mast standing upright on the traveling vehicle in a manner that allows the vertical movement base to move up and down. A holding unit may be mounted to the vertical movement base of the stacker crane in a manner that allows the holding unit to project and retract.

(2) In the above illustrative embodiment, the traveling units 50 of the first and second overhead transport vehicles B1 and B2 have the same configuration, and the first and second overhead transport vehicles B1 and B2 travel on the common travel rail 41. Alternatively, if the first and second overhead transport vehicles B1 and B2 can travel on the common travel rail 41, the first and second overhead transport vehicles B1 and B2 may have different specific configurations.

(3) In the above illustrative embodiment, the first and second overhead transport vehicles B1 and B2 include the holding units 51 having the same configuration. Alternatively, the holding units 51 of the first and second overhead transport vehicles B1 and B2 may have different configurations.

(4) In the above illustrative embodiment, as the travel paths L, provided are the two loop-like main travel paths 44 that are arranged in the path lateral width direction and formed into a double loop, and the loop-like sub-travel paths 43 that are formed and arranged on both sides of the main travel paths 44. Alternatively, the specific configuration of the travel paths L can be variously changed. For example, the loop-like sub-travel paths 43 may be formed and arranged on one side of the main travel paths 44.

(5) In the above illustrative embodiment, the first and second storage and retrieval units F1 and F2 include a roller conveyor for moving the container both into and out of storage. Alternatively, a roller conveyor for moving the container into storage and a roller conveyor for moving the container out of storage may be separately provided.

(6) In the above illustrative embodiment, the first and second storage and retrieval units F1 and F2 include a roller conveyor. Alternatively, the specific configuration of the first and second storage and retrieval units F1 and F2 may be variously changed. For example, the first and second storage and retrieval units F1 and F2 may include a container carrying base that is allowed to move into and out of the storage rack 1.

The invention claimed is:

1. An article storage facility comprising:
   a storage rack configured to store a semiconductor wafer and a reticle;
   a storage and retrieval transport apparatus;
   a first accommodation unit provided in the storage rack and configured to store a wafer container for containing the semiconductor wafer;
   a second accommodation unit provided in the storage rack and configured to store a reticle container for containing the reticle,
   a wall-like structure forming an arrangement space therein where the storage and retrieval transport apparatus, the first accommodation unit, and the second accommodation unit are arranged;
   a first transport apparatus provided so as to correspond to a first opening formed in the wall-like structure and configured to transport, between inside and outside of the arrangement space via the first opening, the wafer container transported between the storage and retrieval transport apparatus and an external transport apparatus outside the arrangement space; and
   a second transport apparatus provided so as to correspond to a second opening formed in the wall-like structure separately from the first opening, the second opening being formed with an opening direction different from an opening direction of the first opening, and configured to transport, between inside and outside of the arrangement space via the second opening, the reticle container transported between the storage and retrieval transport apparatus and an external transport apparatus outside the arrangement space;
   wherein the storage and retrieval transport apparatus includes a holding unit configured to hold a top flange formed at an upper portion of the wafer container to support the wafer container in a hanging state; and
   a flange portion configured to allow the storage and retrieval transport apparatus to hold the reticle container using the holding unit to support the reticle container in a hanging state is formed at an upper portion of the reticle container,
   the storage and retrieval transport apparatus transports the wafer container between the first transport apparatus and the first accommodation unit, and the reticle container between the second transport apparatus and the second accommodation unit.

2. The article storage facility according to claim 1, wherein the storage rack is provided, extending through a plurality of levels of a building, and the first and second transport apparatus are provided on each of at least two of the plurality of levels.

3. The article storage facility according to claim 1, wherein the storage and retrieval transport apparatus includes a container discriminating sensor configured to determine whether or not the holding unit is holding the wafer container and whether or not the holding unit is holding the reticle container.

4. The article storage facility according to claim 3,
   wherein the container discriminating sensor is a sensor configured to detect a distance to the container held by the holding unit.

5. An article transport facility comprising:
   the article storage facility according to claim 1;
   a first overhead transport vehicle configured to transport the wafer container between the first transport apparatus and a wafer input and output unit in an exposure process apparatus; and
   a second overhead transport vehicle configured to transport the reticle container between the second transport apparatus and a reticle input and output unit in the exposure process apparatus,
   wherein at least a portion of travel paths for the first and second overhead transport vehicles is a common travel path portion on which both the first and second overhead transport vehicles travel, and
   wherein the first and second overhead transport vehicles each travel on a travel rail provided on a ceiling side along the travel paths.

6. The article storage facility according to claim 1,
   wherein the wall-like structure includes a first wall portion and a second wall portion facing each other with the arrangement space therebetween, and
   wherein the first opening is formed in the first wall portion, and the second opening is formed in the second wall portion with an opening direction opposite to an opening direction of the first opening.

7. The article storage facility according to claim 1,
   wherein the first transport apparatus and the second transport apparatus are provided at the same fixed height.

8. The article storage facility according to claim 1,
wherein each of the first transport apparatus and the second transport apparatus is a conveyor provided continuously from inside to outside of the arrangement space.

9. The article storage facility according to claim 1,
wherein the storage and retrieval transport apparatus is provided with a container transfer device configured to select a location of an object to be transferred by turning about a pivotal axis extending in a vertical direction, and
the first accommodation unit and the second accommodation unit are arranged in a circumferential direction in reference to the pivotal axis.

10. The article storage facility according to claim 9,
wherein the top flange and the flange portion are rectangular as viewed from the top, and
the first accommodation unit and the second accommodation unit are arranged to allow the top flange of the wafer container stored in the first accommodation unit and the flange portion of the reticle container stored in the second accommodation unit to be oriented toward the pivotal axis in the same direction as viewed from the top.

11. The article storage facility according to claim 9,
wherein the first transport apparatus and the second transport apparatus are arranged to allow a first transfer location in which the wafer container is transferred between the storage and retrieval transport apparatus and the first transport apparatus and a second transfer location in which the reticle container is transferred between the storage and retrieval transport apparatus and the second transport apparatus to be arranged in the circumferential direction.

12. The article storage facility according to claim 11,
wherein the first transport apparatus includes an orientation changing device for changing an orientation of the wafer container as viewed from the top in the first transfer location, and
wherein the second transport apparatus includes an orientation changing device for changing an orientation of the reticle container as viewed from the top in the second transfer location.

* * * * *